(12) United States Patent
Kwon et al.

(10) Patent No.: US 11,883,905 B2
(45) Date of Patent: Jan. 30, 2024

(54) WAFER PROCESSING APPARATUS AND METHOD OF MANUFACTURING SEMICONDUCTOR DEVICE USING THE SAME

(71) Applicant: Samsung Electronics Co., Ltd., Suwon-si (KR)

(72) Inventors: Youngchul Kwon, Asan-si (KR); Manhee Han, Cheonan-si (KR)

(73) Assignee: Samsung Electronics Co., Ltd.

( * ) Notice: Subject to any disclaimer, the term of this patent is extended or adjusted under 35 U.S.C. 154(b) by 510 days.

(21) Appl. No.: 17/139,515

(22) Filed: Dec. 31, 2020

(65) Prior Publication Data

US 2021/0354247 A1    Nov. 18, 2021

(30) Foreign Application Priority Data

May 14, 2020   (KR) .................. 10-2020-0057815

(51) Int. Cl.
| | |
|---|---|
| *H01S 3/23* | (2006.01) |
| *G02B 19/00* | (2006.01) |
| *H01L 21/67* | (2006.01) |
| *H01L 21/683* | (2006.01) |
| *B23K 26/53* | (2014.01) |

(Continued)

(52) U.S. Cl.
CPC .......... *B23K 26/53* (2015.10); *B23K 26/0624* (2015.10); *B23K 26/0665* (2013.01); *B23K 26/705* (2015.10); *G02B 19/0009* (2013.01); *G02B 19/0047* (2013.01); *H01L 21/67115* (2013.01); *H01L 21/78* (2013.01); *H01S 3/2316* (2013.01); *B23K 26/0648* (2013.01); *B23K 2103/56* (2018.08); *H01L 21/6836* (2013.01);

(Continued)

(58) Field of Classification Search
CPC .......... B23K 26/53; B23K 26/0624; B23K 26/0665; B23K 26/705; B23K 26/0648; B23K 2103/56; B23K 26/0622; B23K 26/38; B23K 2101/40; G02B 19/0009; G02B 19/0047; G02B 27/09; H01L 21/67115; H01L 21/78; H01L 21/6836; H01L 2221/68327; H01L 21/67092; H01S 3/2316; H01S 3/067; H01S 3/0085; H01S 3/06758; H01S 3/1305

See application file for complete search history.

(56) References Cited

U.S. PATENT DOCUMENTS 4,087,651 A * 5/1978 Taneda ............... G11B 7/14
5,347,356 A * 9/1994 Ota ................. G03F 7/70633
                                                   356/490

(Continued)

FOREIGN PATENT DOCUMENTS

KR      101825922 B1    3/2018

*Primary Examiner* — Nahida Sultana
(74) *Attorney, Agent, or Firm* — Myers Bigel, P.A.

(57) ABSTRACT

A wafer processing apparatus includes: a laser apparatus configured to generate a laser beam; a focusing lens optical system configured to focus the laser beam on an inside of a wafer; an arbitrary wave generator configured to supply driving power to the laser apparatus; and a controller configured to control the arbitrary wave generator, wherein the laser beam includes a plurality of pulses sequentially emitted from the laser apparatus, and wherein each of the plurality of pulses is a non-Gaussian pulse, and a full width at half maximum (FWHM) of each of the plurality of pulses ranges from 1 ps to 500 ns.

20 Claims, 18 Drawing Sheets

(51) Int. Cl.
 *H01L 21/78* (2006.01)
 *B23K 26/0622* (2014.01)
 *B23K 26/06* (2014.01)
 *B23K 26/70* (2014.01)
 *B23K 103/00* (2006.01)
 *H01S 3/067* (2006.01)

(52) U.S. Cl.
 CPC ..... *H01L 2221/68327* (2013.01); *H01S 3/067* (2013.01)

(56) References Cited

U.S. PATENT DOCUMENTS

| | | | |
|---|---|---|---|
| 5,394,260 A * | 2/1995 | Suzuki | G02F 1/0121 372/12 |
| 6,947,454 B2 | 9/2005 | Sun et al. | |
| 8,367,968 B2 | 2/2013 | Cordingley et al. | |
| 9,036,247 B2 | 5/2015 | Cordingley et al. | |
| 2002/0011852 A1* | 1/2002 | Mandelis | G01R 31/311 324/750.02 |
| 2003/0041669 A1* | 3/2003 | Degertekin | G01N 29/346 73/105 |
| 2011/0174787 A1 | 7/2011 | Ide et al. | |
| 2015/0034613 A1 | 2/2015 | Hosseini | |
| 2016/0243646 A1 | 8/2016 | Kleinert et al. | |
| 2018/0207748 A1 | 7/2018 | Oehler et al. | |
| 2021/0101231 A1* | 4/2021 | Hayden | H01M 10/058 |
| 2021/0230060 A1* | 7/2021 | Magalhães Mendes | C03C 27/046 |

\* cited by examiner

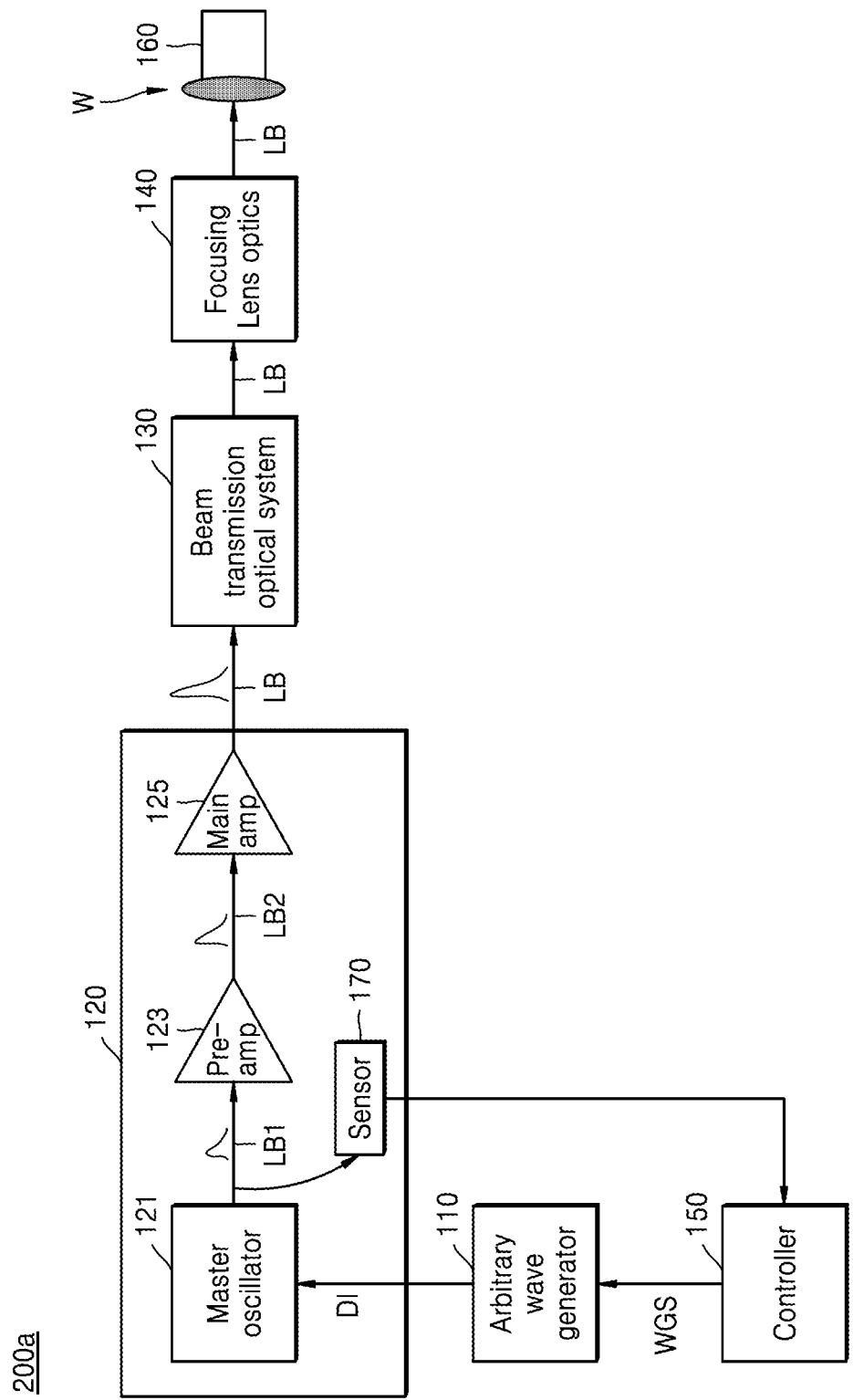

WAFER PROCESSING APPARATUS AND METHOD OF MANUFACTURING SEMICONDUCTOR DEVICE USING THE SAME

CROSS-REFERENCE TO RELATED APPLICATION

This application claims the benefit of Korean Patent Application No. 10-2020-0057815, filed on May 14, 2020, in the Korean Intellectual Property Office, the disclosure of which is incorporated by reference herein in its entirety.

BACKGROUND

The inventive concept relates to a wafer processing apparatus and a method of manufacturing a semiconductor device using the wafer processing apparatus, and more particularly, to a wafer processing apparatus configured to perform a stealth dicing process and a method of manufacturing a semiconductor device using the wafer processing apparatus.

A laser processing process refers to a process of processing a shape or physical property of the surface of a workpiece by scanning a laser beam on the surface of the workpiece. The laser processing process includes, for example, a patterning process of forming a pattern on the surface of the workpiece, a process of modifying the physical properties of the workpiece, such as wafer annealing, a molding process of changing the shape of the workpiece through heat melting, a cutting process of cutting the workpiece into a plurality of units through heat melting, etc.

The cutting process using a laser beam according to the related art cuts the workpiece by irradiating the workpiece with laser light of a wavelength band having a high absorption rate and heating and melting the workpiece. When a wafer is melted and cut, there is a problem in that not only a cutting region but also a surrounding region is melted and a part of a semiconductor device formed on the wafer is damaged.

To solve this problem, a stealth dicing technology of focusing the laser beam on an inside of the workpiece and inducing an internal breakage is used.

SUMMARY

The inventive concept provides a wafer processing apparatus having enhanced reliability and a method of manufacturing a semiconductor device using the wafer processing apparatus.

Objects of the inventive concept are not limited to the aforesaid, and other objects not described herein will be clearly understood by those of ordinary skill in the art from descriptions below.

According to another aspect of the inventive concept, there is provided a wafer processing apparatus. The wafer processing apparatus may include: a laser apparatus configured to generate a laser beam; a focusing lens optical system configured to focus the laser beam on an inside of a wafer; an arbitrary wave generator configured to supply driving power to the laser apparatus; and a controller configured to control the arbitrary wave generator, wherein the laser beam includes a plurality of pulses sequentially emitted from the laser apparatus, and wherein each of the plurality of pulses is a non-Gaussian pulse, and a full width at half maximum (FWHM) of each of the plurality of pulses ranges from 1 ps to 500 ns.

According to another aspect of the inventive concept, there is provided a wafer processing apparatus configured to perform a stealth dicing process on a wafer. The wafer processing apparatus may include: a laser apparatus configured to output a laser beam including a plurality of non-Gaussian pulses; focusing lens optics configured to focus the laser beam on an inside of the wafer; and an arbitrary wave generator configured to provide a non-sinusoidal continuous wave power to the laser apparatus.

According to another aspect of the inventive concept, there is provided a wafer processing apparatus including: a laser apparatus configured to generate a laser beam; focusing lens optics configured to focus the laser beam on an inside of a wafer; an arbitrary wave generator configured to supply driving power to the laser apparatus; and a controller configured to control the arbitrary wave generator, wherein the laser beam includes a plurality of pulses sequentially emitted from the laser apparatus, and wherein a rise time taken for an intensity of each of the plurality of pulses to rise from 10% of a peak point to 90% of the peak point of is 1% or more of a full width at half maximum (FWHM) of each of the plurality of pulses and less than 50% of the FWHM.

According to another aspect of the inventive concept, there is provided a method of manufacturing a semiconductor device. The method may include: forming a plurality of semiconductor devices on a wafer; forming an internal breakage on the wafer along a scribe lane defined on the wafer and being a separation region between the plurality of semiconductor devices; and separating the plurality of semiconductor devices, wherein the forming of the internal breakage on the wafer includes: irradiating a laser beam focused inside the wafer, wherein the laser beam includes a plurality of pulses in which a time interval from a start point to a peak point of each of the plurality of pulses is less than a time interval from the peak point to an end point of each of the plurality of pulses.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings. Like numeral references refer to like elements, and their repetitive descriptions may be omitted in the interest of brevity.

Figure 1:
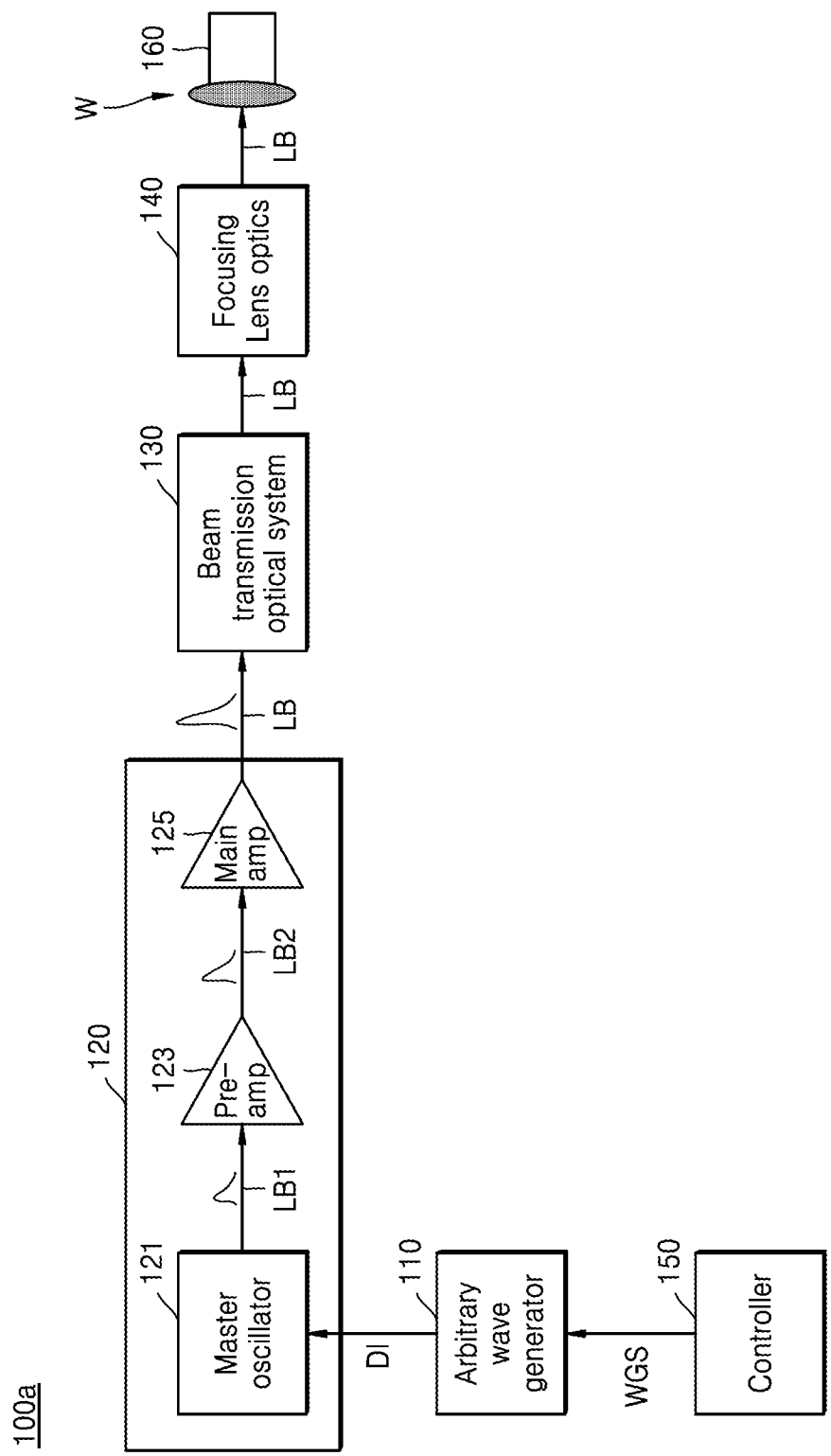
FIG. 1 is a block diagram illustrating a wafer processing apparatus according to embodiments.

FIG. 1 is a block diagram illustrating a wafer processing apparatus 100a according to embodiments.

Figure 2:
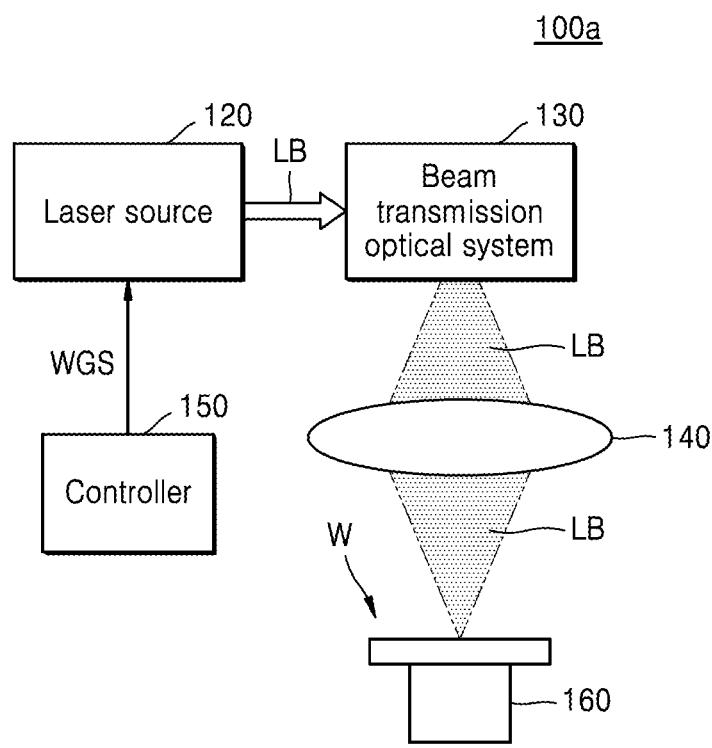
FIG. 2 is a schematic diagram illustrating the wafer processing apparatus according to embodiments.

FIG. 2 is a schematic diagram illustrating the wafer processing apparatus 100a according to embodiments.

Figure 3:
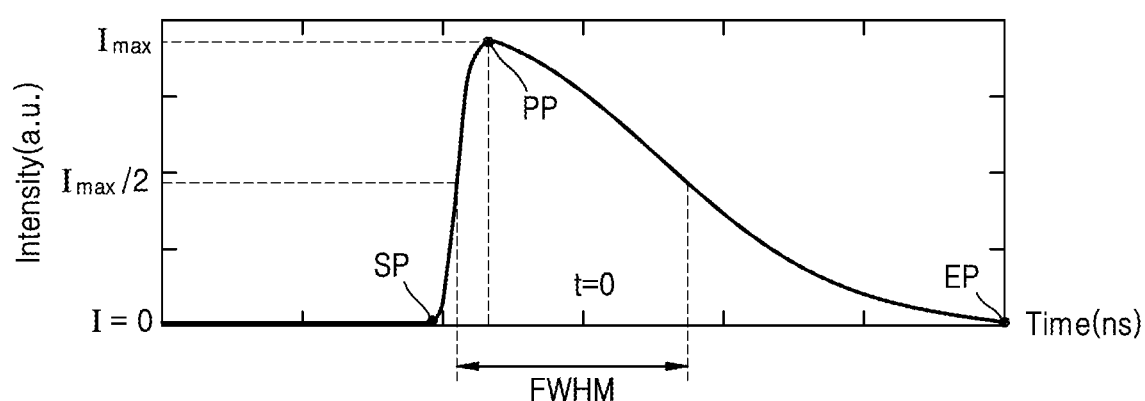
FIG. 3 is a graph illustrating the wafer processing apparatus according to embodiments.

FIG. 3 is a graph illustrating the wafer processing apparatus 100a according to embodiments. More specifically, FIG. 3 shows an intensity-time profile of a single pulse output by a laser apparatus 120 of FIGS. 1 and 2.

Referring to FIGS. 1 to 3, the wafer processing apparatus 100a may include an arbitrary wave generator 110, the laser apparatus 120, a beam transmission optical system 130, focusing lens optics or focusing lens optical system 140, a controller 150, and a wafer support 160.

The wafer processing apparatus 100a may perform a stealth dicing process. Stealth dicing is a process of separating a wafer on which a semiconductor device is formed at high precision and high speed. Stealth dicing is a technology of focusing a laser beam LB in a wavelength band (that is, a wavelength band having a low absorption rate of the wafer W) that may transmit through the wafer W on a place inside the wafer W through the surface of the wafer W.

In the stealth dicing technology, the laser beam LB may be irradiated repeatedly with a pulse that continues for a very short time (e.g., 1 μs or less), and focused on a small region on the wafer W. That is, the laser beam LB may have spatially (via focusing) and temporally (via pulsing), for example, a high peak power density of about $1 \times 10^8$ [W/cm$^2$] near a focal point set inside the wafer W. The laser beam LB having a high peak power density may cause a nonlinear absorption effect with respect to the wafer W near the focal point, and accordingly, the laser beam LB transmitting through the surface of the wafer W may be absorbed at a high absorption rate near the focal point inside the wafer W. Therefore, a high density defect (e.g., a dislocation) may occur in a part of the wafer W where the laser beam LB is absorbed, and a vertical breakage of the wafer W may be facilitated.

The arbitrary wave generator 110 is an apparatus that generates a clock signal based on an external clock signal, and may include a clock oscillator, a memory address controller, a wave memory, a shift register, an analog output circuit, etc.

According to some embodiments, the arbitrary wave generator 110 may generate a driving current DI according to a wave generation signal WGS of the controller 150. The arbitrary wave generator 110 may supply the generated driving current DI to a main or master oscillator 121. According to some embodiments, the arbitrary wave generator 110 may supply the driving current DI that is a non-sinusoidal continuous wave such that the main oscillator 121 generates a first laser beam LB1 that comprises non-Gaussian pulses.

According to some embodiments, the laser apparatus 120 may be a master oscillator and power amplifier (MOPA) laser apparatus. The laser apparatus 120 may be an optical fiber laser apparatus. The main oscillator 121, a pre-amplifier 123, and a main amplifier 125 included in the laser apparatus 120 may be coupled to each other with an optical fiber. However, the inventive concept is not limited thereto, and the laser apparatus 120 may be a MOPA laser including a solid bulk laser and a bulk amplifier, or a MOPA laser including a tunable external cavity diode laser and a semiconductor optical amplifier.

According to some embodiments, the main oscillator 121 may include a fiber laser doped with any one of ytterbium (Yb), erbium (Er), thulium (Tm), and holmium (Ho). According to some embodiments, the main oscillator 121 may generate the first laser beam LB1 having a wavelength of about 0.8 μm to about 1.4 μm. According to some embodiments, the first laser beam LB1, a second laser beam LB2, and the laser beam LB may have a wavelength of about 1064 μm.

According to some embodiments, the main oscillator 121 may operate in a Q switching manner. The laser apparatus 120 may generate the first laser beam LB1 at a pulse frequency of several hundreds of kHz. However, the inventive concept is not limited thereto, and according to some embodiments, the main oscillator 121 may operate in a mode-locking manner.

The main oscillator 121 may include a seed laser diode, an optical fiber including a gain medium, and first and second mirrors facing each other to oscillate the first laser beam LB1. The seed laser diode may be a diode that generates a laser by using a forward semiconductor junction as an active medium. When current is supplied to the seed laser diode, light may be emitted while an inversion occurs between the density of a high energy level and the density of a low energy level in the semiconductor junction.

The light emitted from the seed laser diode may be used as pumping energy with respect to the optical fiber including a gain medium. When a plurality of seed laser diodes are provided, a pump-signal coupling apparatus may be intervened or disposed between the plurality of seed laser diodes and the optical fiber. The pump-signal coupling apparatus may combine optical signals output from the plurality of seed laser diodes into one optical signal and transmit the optical signal to the optical fiber including the gain medium.

Most of light emitted by the spontaneous emission or induced emission from the gain medium of the optical fiber may have a weak directionality. The first and second mirrors may reflect the light emitted from the gain medium back to the gain medium, and thus oscillation in which induced emission of a gain material is repeated may occur. Part of the light that is repeatedly reflected between the first and second mirrors may pass through the second mirror and be output as the first laser beam LB1. The first laser beam LB1 may be coherent light.

The main oscillator 121 may further include an optical modulator for adjusting the intensity-time profile of the first laser beam LB1. The optical modulator may include an aperture capable of transmitting or shielding the first laser beam LB1, and adjust the intensity-time profile of the first laser beam LB1 by adjusting the transmittance of the first laser beam LB1 transmitting the aperture.

The pre-amplifier 123 may include a first pump laser diode, and the main amplifier 125 may include a second pump laser diode. According to some embodiments, a plurality of first pump laser diodes included in the pre-amplifier 123 may be provided. According to some embodiments, a plurality of second pump laser diodes included in the main amplifier 125 may be provided.

The pre-amplifier 123 may amplify the first laser beam LB1 to output the second laser beam LB2. The second laser beam LB2 may have the same wavelength as the first laser beam LB1. The main amplifier 125 may amplify the second laser beam LB2 to output the laser beam LB. The laser beam LB may have the same wavelength as the second laser beam LB2.

The first laser beam LB1, the second laser beam LB2, and the laser beam LB may have the same intensity-time profile by adjusting an amplification ratio. For example, the first laser beam LB1, the second laser beam LB2, and the laser beam LB may have substantially the same pulse width, kurtosis, and skewness. However, the inventive concept is not limited thereto, and any one of the first and second laser beams LB1 and LB2 may have a different pulse width, kurtosis, and skewness than the laser beam LB.

The first pump laser diode included in the pre-amplifier 123 may generate a first pump laser beam. The second pump laser diode included in the main amplifier 125 may generate a second pump laser beam. The first pump laser beam may join an optical path of the first laser beam LB1 by an optical coupler, and the second pump laser beam may join an optical path of the second laser beam LB2 by the optical coupler. The first and second pump laser diodes may be driven by radio frequency (RF) power.

According to some embodiments, the first and second pump laser beams may have different wavelengths from the first laser beam LB1. According to some embodiments, the first and second pump laser beams may have shorter wavelengths than the first laser beam LB1. According to some embodiments, the first and second pump laser beams may have wavelengths having a higher absorption rate with respect to the optical fiber than the laser beam LB. As the first pump laser beam is absorbed by the optical fiber, the first laser beam LB1 may be amplified and the second laser beam LB2 may be output. As the second pump laser beam is absorbed by the optical fiber, the second laser beam LB2 may be amplified and the laser beam LB may be output. However, the inventive concept is not limited thereto, and the first and second pump laser beams may have the same wavelength as the first laser beam LB1.

According to some embodiments, an isolator may be provided each between the main oscillator 121 and the pre-amplifier 123 and between the pre-amplifier 123 and the main amplifier 125. The isolator may be also referred to as an optical diode, and is an optical component that allows light to be transmitted in only one direction. The isolator may prevent reverse propagation of the first laser beam LB1 and the second laser beam LB2.

According to some embodiments, an additional pre-amplifier may be further provided between the pre-amplifier 123 and the main amplifier 125 depending on the intensity of the laser beam LB that is finally output from the laser apparatus 120. For example, the laser apparatus 120 may include two or more pre-amplifiers. The isolator and a collimator may be provided in an output terminal where the laser beam LB is output from the laser apparatus 120.

According to some embodiments, the intensity-time profile (hereinafter, a time profile) of the single pulse (hereinafter simply, a single pulse) included in the first laser beam LB1, the second laser beam LB2, and the laser beam LB may differ from the Gaussian distribution. According to some embodiments, the time profile of the single pulse may be different from the Laurentian distribution.

According to some embodiments, the full width at half maximum (FWHM) of the single pulse may range from about 1 ps to about 1 μs. According to some embodiments, the FWHM of the single pulse may be about 500 ns or less. According to some embodiments, the FWHM of the single pulse may be about 400 ns or less. According to some embodiments, the FWHM of the single pulse may be about 300 ns or less.

According to some embodiments, the time profile of the single pulse may be asymmetric with respect to the center of the pulse. Here, the center of the pulse means a midpoint of the start and end points of the pulse (e.g., a point where t=0 in FIG. 3). According to some embodiments, the time interval from a start point SP of the single pulse to a peak point PP of the intensity may be less than the time interval from the peak point PP of the intensity to an end point EP of the single pulse.

According to some embodiments, a rise time may be about 1% or more and less than about 50% of the FWHM of the single pulse. Here, the rise time means a time taken for the intensity of the single pulse to increase from 10% of the peak point PP to 90% of the peak point PP. According to some embodiments, the rise time may be less than or equal to about 40% of the FWHM. According to some embodiments, the rise time may be about 30% or less of the FWHM. According to some embodiments, the rise time may be about 20% or less of the FWHM. According to some embodiments, the rise time may be about 10% or less of the FWHM.

According to some embodiments, the peak power of the single pulse may range from about 1 W to about 1 kW.

According to some embodiments, the average power of the single pulse may range from about 1 W to about 30 W.

According to some embodiments, the time profile of the single pulse may follow Equation 1 below.

$$I(t) = E \frac{\beta}{2\alpha \cdot \Gamma\left(\frac{1}{\beta}\right)} \exp\left[-\left(\frac{t-\mu}{\alpha}\right)^\beta\right]\left[1 + \text{erf}\left(\frac{s}{\sqrt{2}} \cdot \frac{t-\mu}{\alpha}\right)\right] \quad \text{[Equation 1]}$$

Here, E denotes an energy parameter for controlling the energy amount of the pulse, $\alpha$ denotes a pulse width parameter for controlling the pulse width of the pulse, $\beta$ denotes a kurtosis parameter for controlling kurtosis of the pulse, and s denotes a skewness parameter for controlling skewness of the pulse. In addition, $\mu$ denotes a parameter for controlling the time axis parallel movement of the pulse, and may be automatically determined by the other parameters E, $\alpha$, $\beta$, and s.

In addition, in Equation 1, the gamma function $\Gamma(z)$ and the Gaussian error function $\text{erf}(x)$ follow Equation 2 below.

$$\Gamma(z) = \int_0^\infty x^{z-1} e^{-x} dx \quad \text{[Equation 2]}$$

$$\text{erf}(x) = \frac{2}{\sqrt{\pi}} \int_0^x e^{-t^2} dt$$

When the single pulse follows a Gaussian profile, $\beta$ may be 2 and s may have a value of 0. According to embodiments, the skewness parameter s of the pulse may have a non-zero value. According to some embodiments, the skewness parameter s of the single pulse may be greater than zero. According to some embodiments, the skewness parameter s of the single pulse may be about 5 or more. According to some embodiments, the skewness parameter s of the single pulse may be about 10 or more. According to some embodiments, the skewness parameter s of the single pulse may be about 100 or less. According to some embodiments, the skewness parameter s of the single pulse may be about 60 or less.

Stealth laser apparatuses according to the related art have performed a stealth dicing process using a laser pulse conforming to the Gaussian profile. However, there is a problem in that depending on the conditions of the stealth laser apparatus and the characteristics of the wafer W on which the process is performed, including that a chip defect occurs in a dicing process because breakage formed inside the wafer W is not transferred to the surface of the wafer W.

There is a problem in that the defect occurring in the dicing process causes permanent damage to the semiconductor chip close to a completion stage, which increases manufacturing cost and decreases yield. In particular, there is a problem in that when the power (e.g., peak power, or average power) of the laser beam increases to enhance individualization performance of the stealth dicing laser, the completed semiconductor devices may be damaged by the laser beam, which deteriorates the yield.

According to embodiments, each of the single pulses constituting the laser beam LB generated by the laser apparatus 120 may have a relatively short rise time, unlike the Gaussian pulse. As will be described below, it has been confirmed that the laser beam LB of a pulse train having a short rise time rapidly increases the temperature near a processing point (i.e., the focus of the laser beam LB) of the wafer W. As a result, the ratio of energy absorbed by a part of the energy of the single pulse near the focal point in the wafer W increases, and thus, breakage may be formed inside the wafer W more effectively. Accordingly, the reliability of the stealth dicing process may be improved. Furthermore, while the power of the laser beam LB is maintained within the range that does not damage the semiconductor device, the division performance may be improved, and thus, the yield of semiconductor device manufacturing may be improved.

The output laser beam LB may be transferred to the focusing lens optics 140 by the beam transmission optical system 130. The beam transmission optical system 130 may be or include free space optics, but is not limited thereto. The beam transmission optical system 130 may include various optical elements such as a polarizer, a lens, a reflector, a prism, a splitter, etc.

The focusing lens optics 140 may focus the laser beam LB on a position set inside the wafer W. The focusing lens optics 140 may include a single lens or may include a plurality of lenses.

The wafer support 160 may support the wafer W while the wafer W is being processed. The wafer support 160 may move the wafer W in a horizontal direction such that the laser beam LB is focused on different parts inside the wafer W. Accordingly, the wafer W may be scanned along a scribe lane SL (see, e.g., FIG. 12A) defined in the wafer W, and breakages may be formed in different parts inside the wafer W.

According to embodiments, the controller 150 may generate a wave generation signal WGS for controlling the arbitrary wave generator 110. The wave generation signal WGS may include bits with respect to a time profile of the driving current DI.

The bit with respect to the time profile of the driving current DI included in the wave generation signal WGS may include, based on the time profile of the driving current DI, i) a bit (hereinafter, an average power control bit) for controlling the average power of the single pulse constituting the first laser beam LB1, ii) a bit (hereinafter, a pulse width control bit) for controlling pulse width of the single pulse constituting the first laser beam LB1, iii) a bit (hereinafter, a kurtosis control bit) for controlling the kurtosis of the single pulse constituting the first laser beam LB1, and iv) a bit (hereinafter, a skewness control bit) for controlling the skewness of the single pulse constituting the first laser beam LB1.

The stealth dicing lasers according to the related art generate a Gaussian laser beam pulse by supplying RF power to a main oscillator and operating the main oscillator in a Q switching manner. According to embodiments, to generate the first laser beam LB1 having the non-Gaussian profile, the wave generation signal WGS may include the average power control bit, the pulse width control bit, the kurtosis control bit, and the skewness control bit.

Here, the controller 150 may be implemented with hardware, firmware, software, or an arbitrary combination thereof. For example, the controller 150 may be a computing device such as a workstation computer, a desktop computer, a laptop computer, or a tablet computer. The controller 150 may be a simple controller, a microprocessor, a central processing unit (CPU), a complicated processor such as a graphics processing unit (GPU), a processor configured with software, dedicated hardware, or dedicated firmware. The controller 150 may be implemented with a general-use computer or application specific hardware such as a digital signal processor (DSP), a field programmable gate array (FPGA), or an application specific integrated circuit (ASIC).

According to some embodiments, an operation of the controller 150 may be implemented as instructions stored in a machine-readable medium capable of being read and executed by one or more processors. In this regard, the machine-readable medium may include an arbitrary mechanism for storing and/or transmitting information readable by a machine (for example, a computing device). For example, the machine-readable medium may include read-only memory (ROM), random access memory (RAM), a magnetic disk storage medium, an optical storage medium, a flash memory device, an electrical, optical, acoustic, or other-type radio signal (for example, a carrier, an infrared signal, a digital signal, or the like), and other arbitrary signals.

In addition, firmware, software, routines, and instructions for performing the operations described with respect to the controller 150 or an arbitrary process described below may be so configured. For example, the controller 150 may be implemented with software that generates a signal for controlling the arbitrary wave generator 110. However, for convenience of description, the operation of the controller 150 described above may be based on a computing device, a processor, a controller, or another device for executing firmware, software, routines, instructions, etc.

Figure 4A:
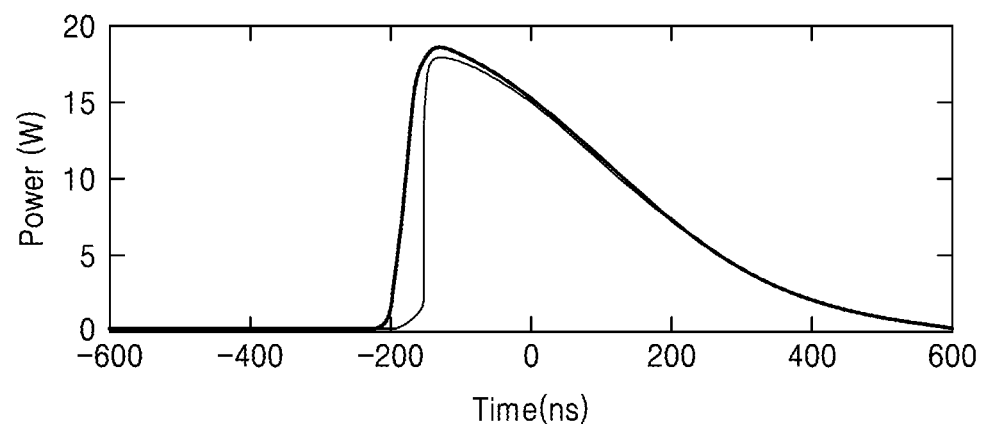
FIGS. 4A to 4C are graphs illustrating the effect of a wafer processing apparatus according to embodiments.
Figure 4B:
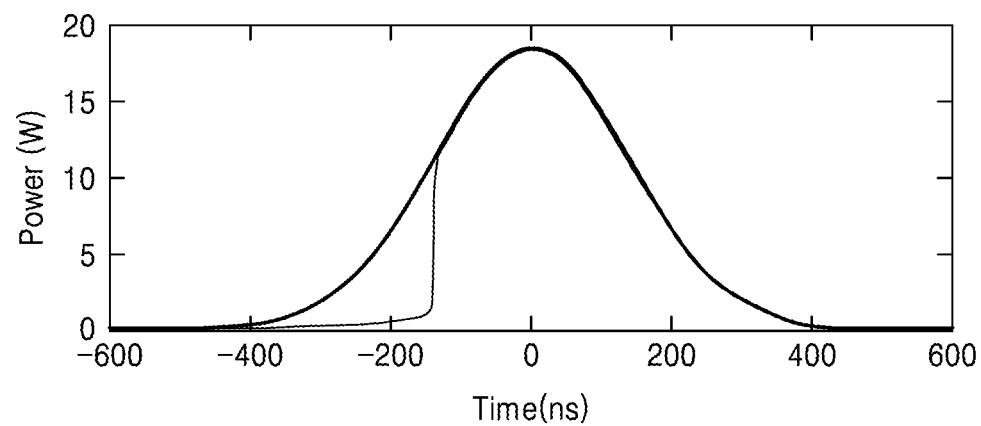
Figure 4C:
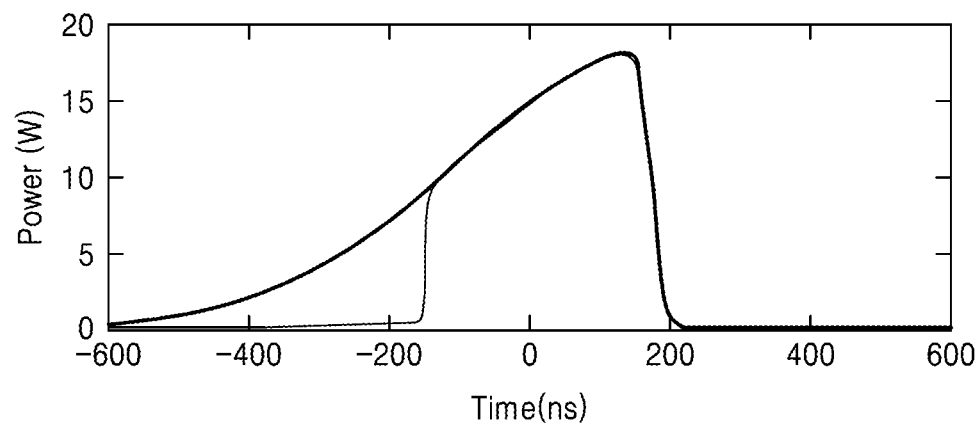

FIGS. 4A to 4C are graphs illustrating the effect of the wafer processing apparatus 100a according to embodiments.

Referring to FIGS. 4A to 4C, thick solid lines indicate the intensity of a single pulse of the laser beam LB (see FIG. 1) over time, and thin solid lines indicate the absorption power of the wafer W (see FIG. 1).

The pulse of FIG. 4A is a leading pulse in which the peak of the pulse is leading the center of the pulse, the pulse of FIG. 4B is the Gaussian pulse of which the peak of the pulse is substantially the same as the center of the pulse, and the pulse of FIG. 4C is a lagging pulse in which the peak of the pulse is lagging the center of the pulse.

Referring to FIGS. 2 and 4A, it is confirmed with the leading pulse that the absorption power of the wafer W rapidly increases, and the wafer W absorbed 92.4% of the energy of the pulse of the laser beam LB.

Referring to FIGS. 2 and 4B, it is confirmed with the Gaussian pulse that the wafer W absorbed 84.6% of the energy of the pulse of the laser beam LB.

Referring to FIGS. 2 and 4C, it is confirmed with the lagging pulse that the rise in the absorption power of the wafer W is delayed, and the wafer W absorbs 77.6% of the energy of the pulse of the laser beam LB.

The wafer processing apparatus 100a according to embodiments may perform a stealth dicing process using the leading pulse, and thus, the absorption rate of the laser beam LB may increase. Accordingly, an internal breakage IB (see, e.g., FIG. 12C) of the wafer W may effectively propagate to the surface of the wafer W, and the reliability of the stealth dicing process and the semiconductor device manufacturing yield may be improved.

In addition, as the absorption rate of the laser beam LB increases, the semiconductor device formed in the wafer W may be prevented from being damaged by the leakage beam, and the yield and reliability of semiconductor device manufacturing may be improved.

Figure 5A:
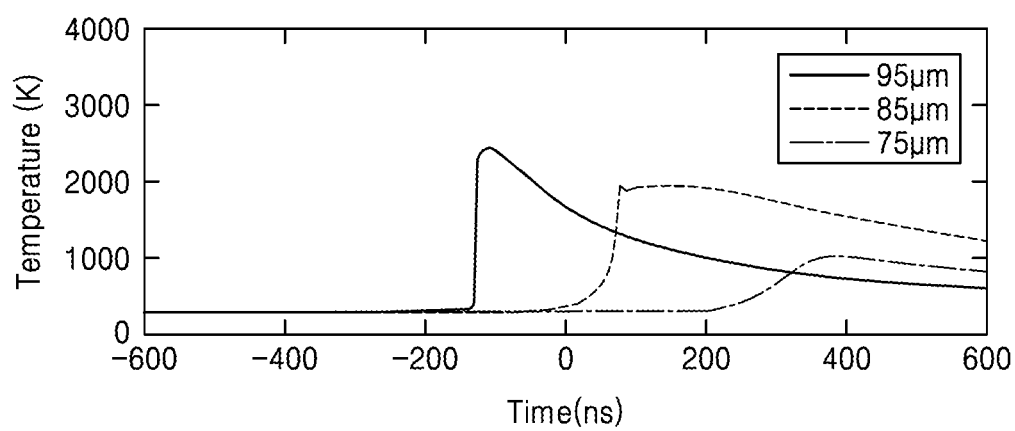
FIGS. 5A to 5C are graphs illustrating the effect of a wafer processing apparatus according to embodiments.
Figure 5B:
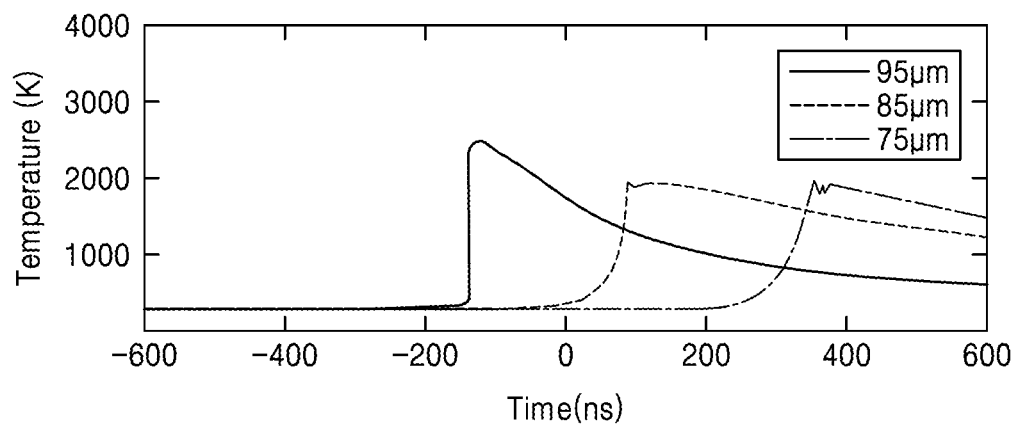
Figure 5C:
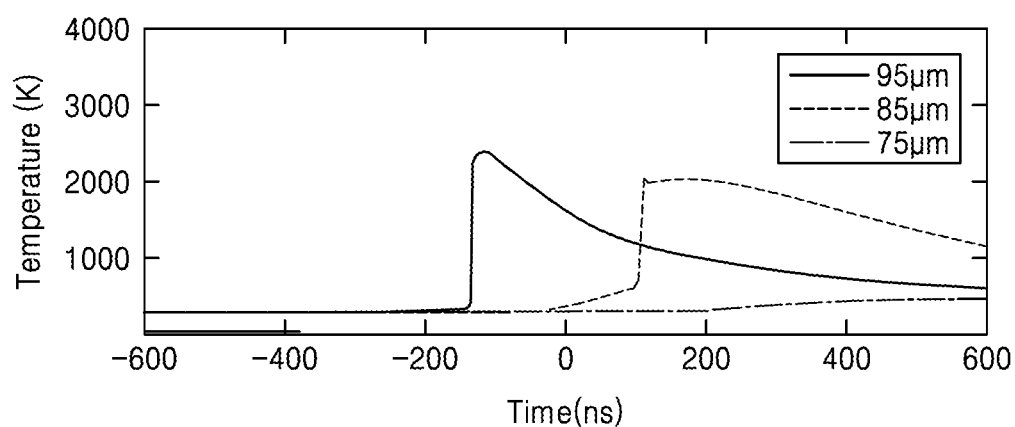

FIGS. 5A to 5C are graphs illustrating the effect of the wafer processing apparatus 100a according to embodiments.

More specifically, FIG. 5A shows the temperature change inside the wafer (W, see FIG. 1) in a stealth dicing process using the laser beam (LB, see FIG. 1) including the Gaussian pulse, FIG. 5B shows the temperature change inside the wafer (W, see FIG. 1) in the stealth dicing process using the laser beam (LB, see FIG. 1) including the leading pulse, and FIG. 5C shows the temperature change inside the wafer (W, see FIG. 1) in the stealth dicing process using the laser beam (LB, see FIG. 1) including the lagging pulse.

In FIGS. 5A to 5C, the vertical depth refers to a depth in a direction perpendicular to the surface of the wafer (W, see FIG. 1) from the surface of the wafer (W, see FIG. 1) on which the laser beam (LB, see FIG. 1) is incident. The focus of the laser beam (LB, see FIG. 1) is at a point where the vertical depth is 100 μm. In FIGS. 5A to 5C, solid lines indicate the temperature change at a point where the vertical depth is 95 μm, broken lines indicate the temperature change at a point where the vertical depth is 85 μm, and dashed-dotted lines indicate the temperature change at a point where the vertical depth is 75 μm.

Referring to FIG. 5A, in the stealth dicing process using the Gaussian pulse, the energy of the pulse propagates well to the point where the vertical depth is 85 μm, and the temperature rises to 2000 K, while the energy of the pulse does not propagate well to the point where the vertical depth is 75 μm, the temperature rises to only about 1000K, and the vertical length of the internal breakage IB is about 50 μm.

Referring to FIG. 5B, in the stealth dicing process using the leading pulse, the energy of the pulse propagates well to the point where the vertical depth is 75 μm and the temperature rises to 2000K. Because the absorption rate of light in a near-infrared band is proportional to the temperature of the wafer (i.e., silicon), the faster the temperature of the wafer (W, see FIG. 1) rises, the faster the absorption rate of the pulses rises, and thus, the ratio of energy lost in the pulse energy may be reduced. It is confirmed that in the case of using the leading pulse, the vertical length of the internal breakage IB is about 61 μm and increases about 21% compared to the case of using the Gaussian pulse.

Referring to FIG. 5C, it is confirmed in the lagging pulse that the energy hardly propagates to the point where the vertical depth is 75 μm, the temperature rise is insignificant and the internal breakage IB is reduced by about 20%.

The wafer processing apparatus 100a (see FIG. 1) according to embodiments has improved internal breakage formation performance. Accordingly, the distance between the internal breakage IB formed in the wafer W may increase compared to the related art, and the number of formations of vertically overlapped internal breakages on the same point may be reduced, and thus, the scanning speed of the stealth dicing process may be improved. Accordingly, the productivity of semiconductor device manufacturing may be improved.

Figure 6A:
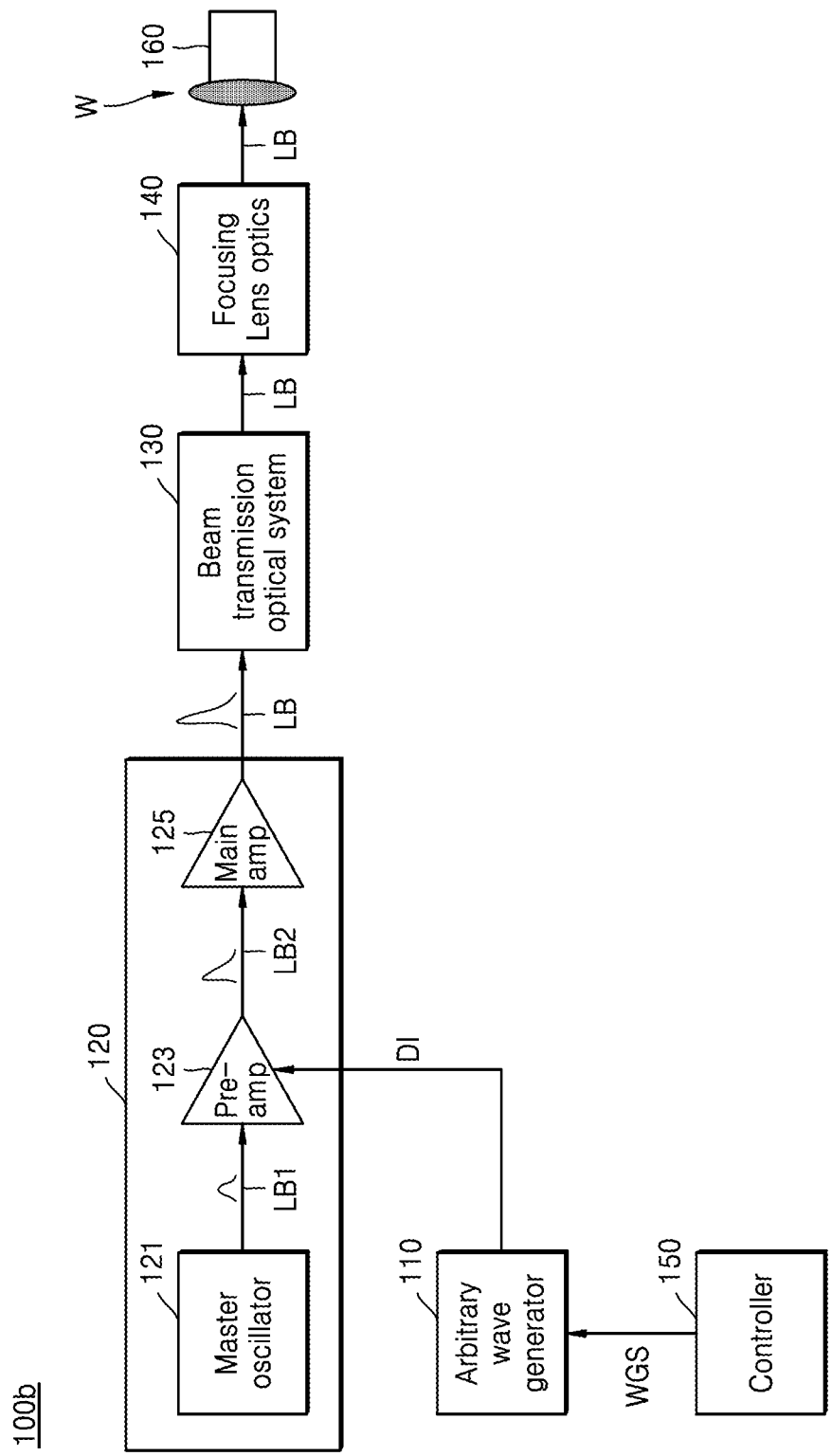
FIGS. 6A and 6B are block diagrams illustrating wafer processing apparatuses according to other embodiments.
Figure 6B:
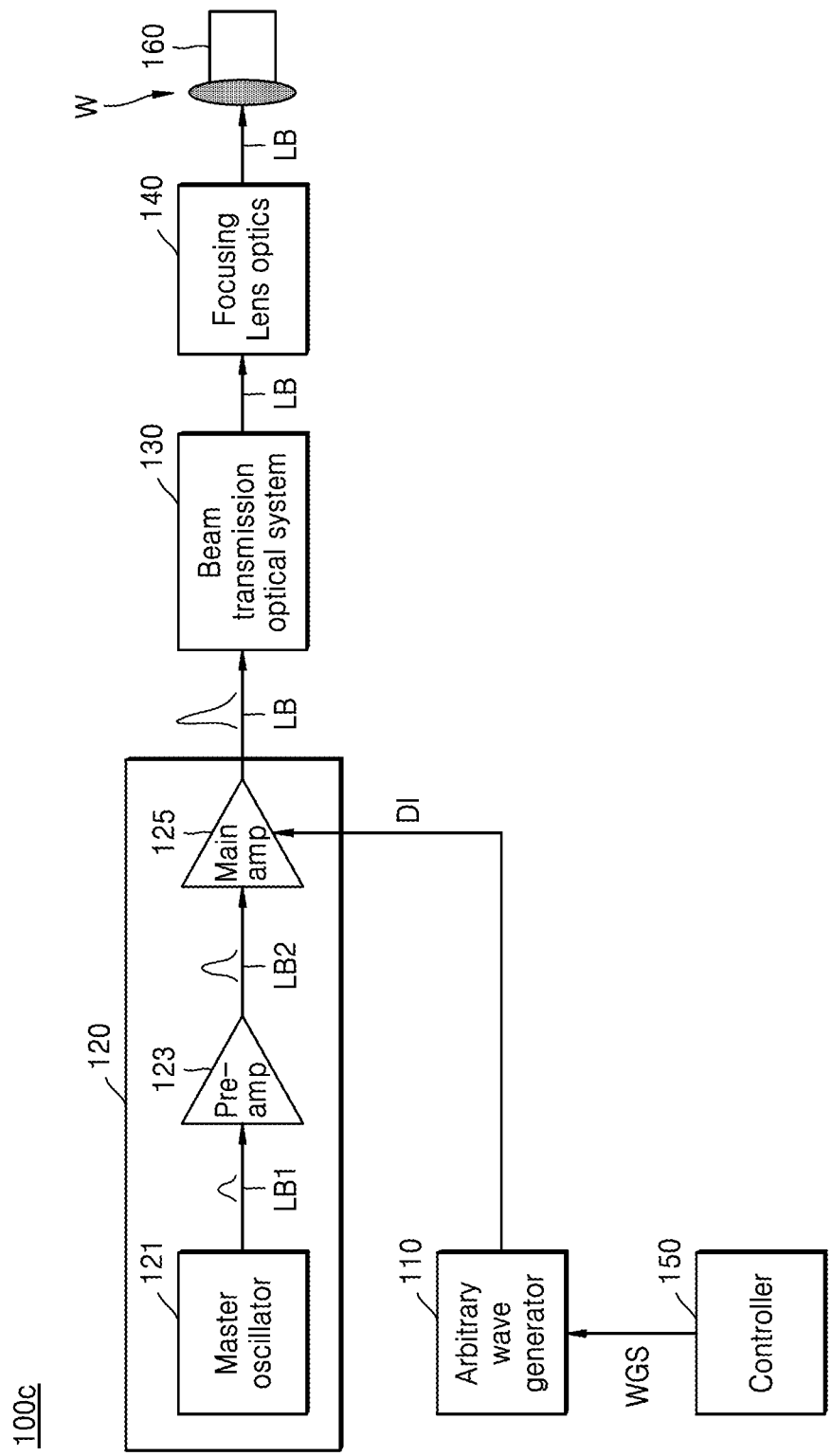

FIGS. 6A and 6B are block diagrams illustrating wafer processing apparatuses 100b and 100c respectively according to other embodiments.

For convenience of description, description which is redundant with the description given above with reference to FIGS. 1 to 3 may be omitted, and a difference will be mainly described.

Referring to FIG. 6A, the wafer processing apparatus 100b may include the arbitrary wave generator 110, the laser apparatus 120, the beam transmission optical system 130, the focusing lens optics 140, the controller 150, and the wafer support 160.

In the wafer processing apparatus 100b, unlike the wafer processing apparatus 100a of FIG. 1, the main or master oscillator 121 may operate based on RF power. Accordingly, the first laser beam LB1 may be the Gaussian pulse.

According to some embodiments, the pre-amplifier 123 may operate based on the driving current DI that is a non-sinusoidal continuous wave. Accordingly, the pre-amplifier 123 may generate the second laser beam LB2 that is a non-Gaussian pulse based on the first laser beam LB1 that is the Gaussian pulse.

The characteristics of the second laser beam LB2 and the laser beam LB are similar to those described with reference to FIGS. 1 to 3.

Referring to FIG. 6B, the wafer processing apparatus 100c may include the arbitrary wave generator 110, the laser apparatus 120, the beam transmission optical system 130, the focusing lens optics 140, the controller 150, and the wafer support 160.

Unlike the wafer processing apparatus 100a of FIG. 1, the wafer processing apparatus 100b may include the main oscillator 121 driven by RF power. Accordingly, the first laser beam LB1 may be the Gaussian pulse.

According to some embodiments, the pre-amplifier 123 may be driven by RF power. Accordingly, the pre-amplifier 123 may generate the second laser beam LB2 that is the Gaussian pulse of larger amplitude based on the first laser beam LB1 that is the Gaussian pulse.

According to some embodiments, the main amplifier 125 may operate based on the driving current DI that is a non-sinusoidal continuous wave. Accordingly, the main amplifier 125 may generate the laser beam LB that is a non-Gaussian pulse based on the second laser beam LB2 that is the Gaussian pulse.

FIG. 7A is a diagram illustrating a wafer processing apparatus 200a according to embodiments.

For convenience of description, description which is the redundant with the description given above with reference to FIGS. 1 to 3 may be omitted, and a difference will be mainly described.

Referring to FIG. 7A, the wafer processing apparatus 200a may further include a sensor 170 in addition to the arbitrary wave generator 110, the laser apparatus 120, the beam transmission optical system 130, the focusing lens optics 140, the controller 150, and the wafer support 160.

The sensor 170 may be coupled to the main oscillator 121 by an optical fiber. The sensor 170 may receive part of the first laser beam LB1 through the optical fiber and generate an electrical signal based on the part of the first laser beam LB1.

The controller 150 may determine whether the profile of a single pulse included in the first laser beam LB1 follows a set profile based on the electrical signal of the sensor 170. The controller 150 may provide the corrected wave generation signal WGS to the arbitrary wave generator 110 based on a measurement result of the sensor 170. For example, when it is determined that the first laser beam LB1 is the Gaussian pulse from the sensor 170, the controller 150 may provide the corrected wave generation signal WGS for correcting the first laser beam LB1 with the preset profile, for example, a non-Gaussian pulse, to the arbitrary wave generator 110. According to some embodiments, a separate processor that generates a feedback signal based on the measurement result of the sensor 170 and provides the feedback signal to the controller 150 may be further provided.

Figure 7B:
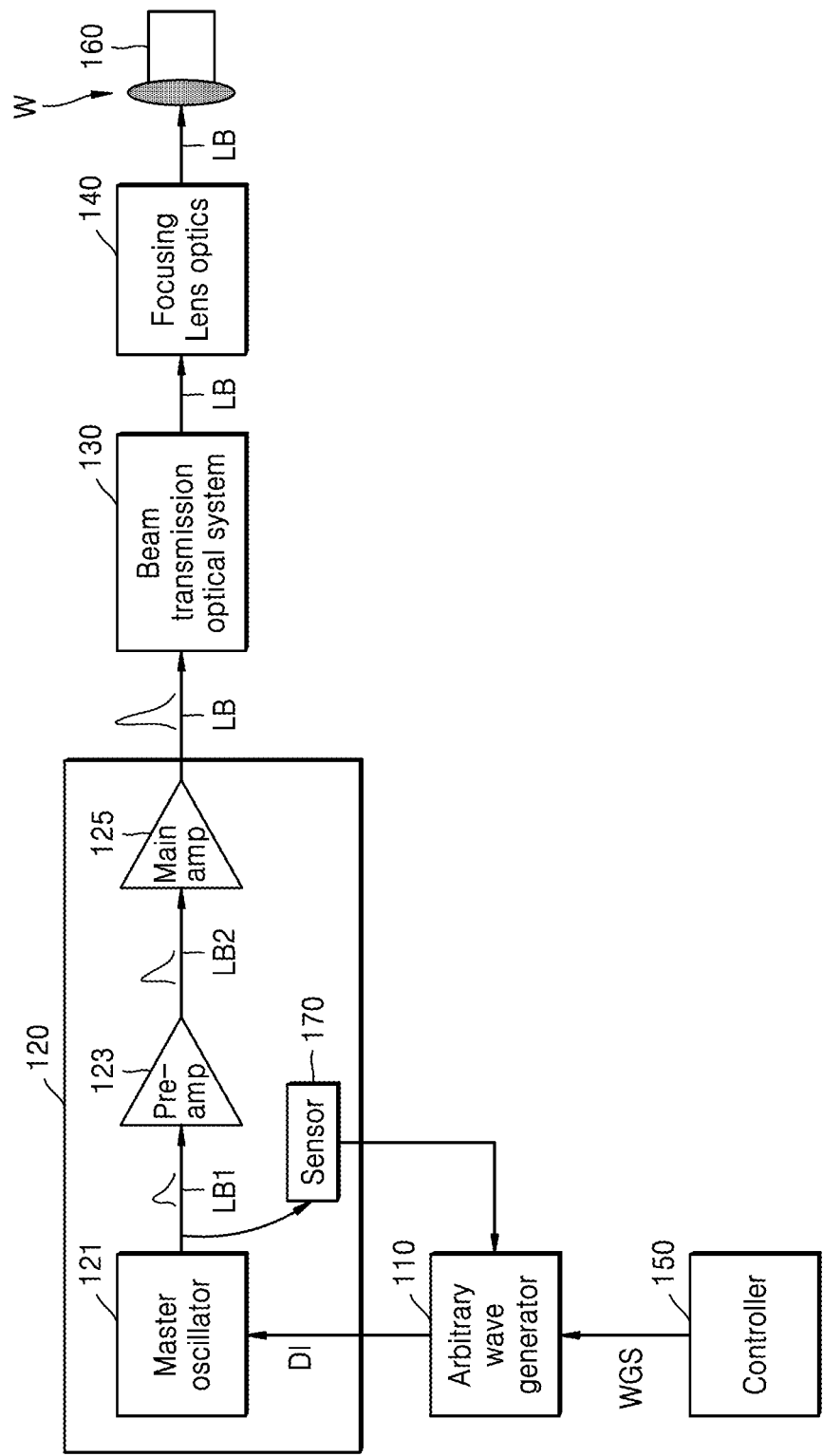
FIGS. 7A to 10 are diagrams illustrating wafer processing apparatuses according to embodiments.

FIG. 7B is a diagram illustrating a wafer processing apparatus 200b according to embodiments.

For convenience of description, description which is redundant with the description given above with reference to FIG. 7A may be omitted, and a difference will be mainly described.

Referring to FIG. 7B, the wafer processing apparatus 200b may include the arbitrary wave generator 110, the laser apparatus 120, the beam transmission optical system 130, the focusing lens optics 140, the controller 150, the wafer support 160, and the sensor 170.

Referring to FIG. 7B, the sensor 170 included in the wafer processing apparatus 200b may transmit an electrical signal to the arbitrary wave generator 110 unlike in FIG. 7A.

The arbitrary wave generator 110 may adjust the driving current DI based on the wave generation signal WGS of the controller 150 and a measurement result of the sensor 170, and thus, the main oscillator 121 may output the laser beam LB having a set wave time profile.

Figure 7C:
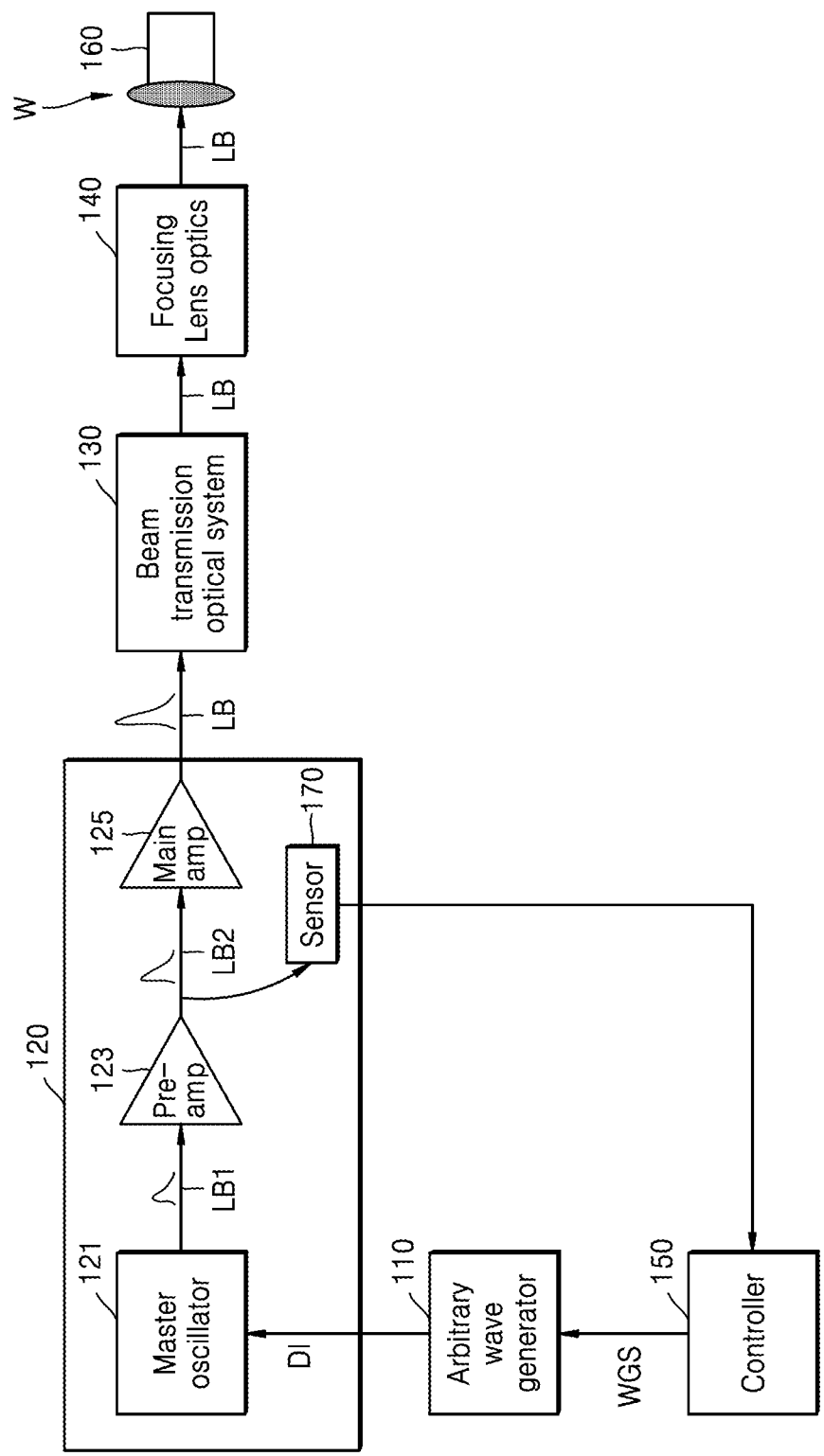

FIG. 7C is a diagram illustrating a wafer processing apparatus 200c according to embodiments.

For convenience of description, description which is redundant with the description given above with reference to FIG. 7A may be omitted, and a difference will be mainly described.

Referring to FIG. 7C, the wafer processing apparatus 200c may include the arbitrary wave generator 110, the laser apparatus 120, the beam transmission optical system 130, the focusing lens optics 140, the controller 150, the wafer support 160, and the sensor 170.

Referring to FIG. 7C, the sensor 170 included in the wafer processing apparatus 200c may be coupled to the pre-amplifier 123 through an optical fiber to sense a part of the second laser beam LB2, unlike in FIG. 7A.

Figure 7D:
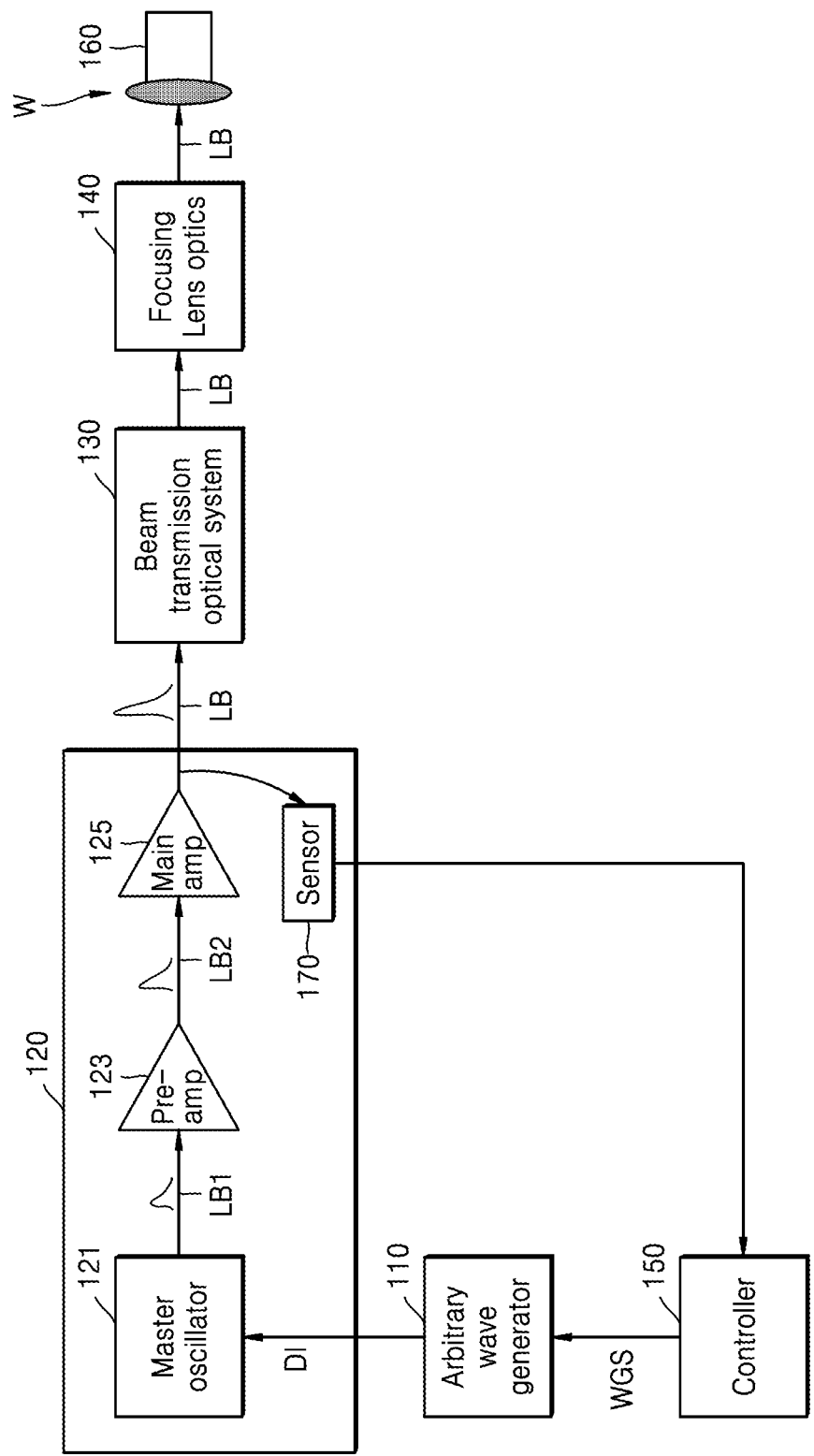

FIG. 7D is a diagram illustrating a wafer processing apparatus 200d according to embodiments.

For convenience of description, description which is redundant with the description given above with reference to FIG. 7A may be omitted, and a difference will be mainly described.

Referring to FIG. 7D, the wafer processing apparatus 200d may include the arbitrary wave generator 110, the laser apparatus 120, the beam transmission optical system 130, the focusing lens optics 140, the controller 150, the wafer support 160, and the sensor 170.

Referring to FIG. 7D, the sensor 170 included in the wafer processing apparatus 200d may be coupled to the main amplifier 125 through an optical fiber to sense a part of the laser beam LB, unlike in FIG. 7A.

Figure 7E:
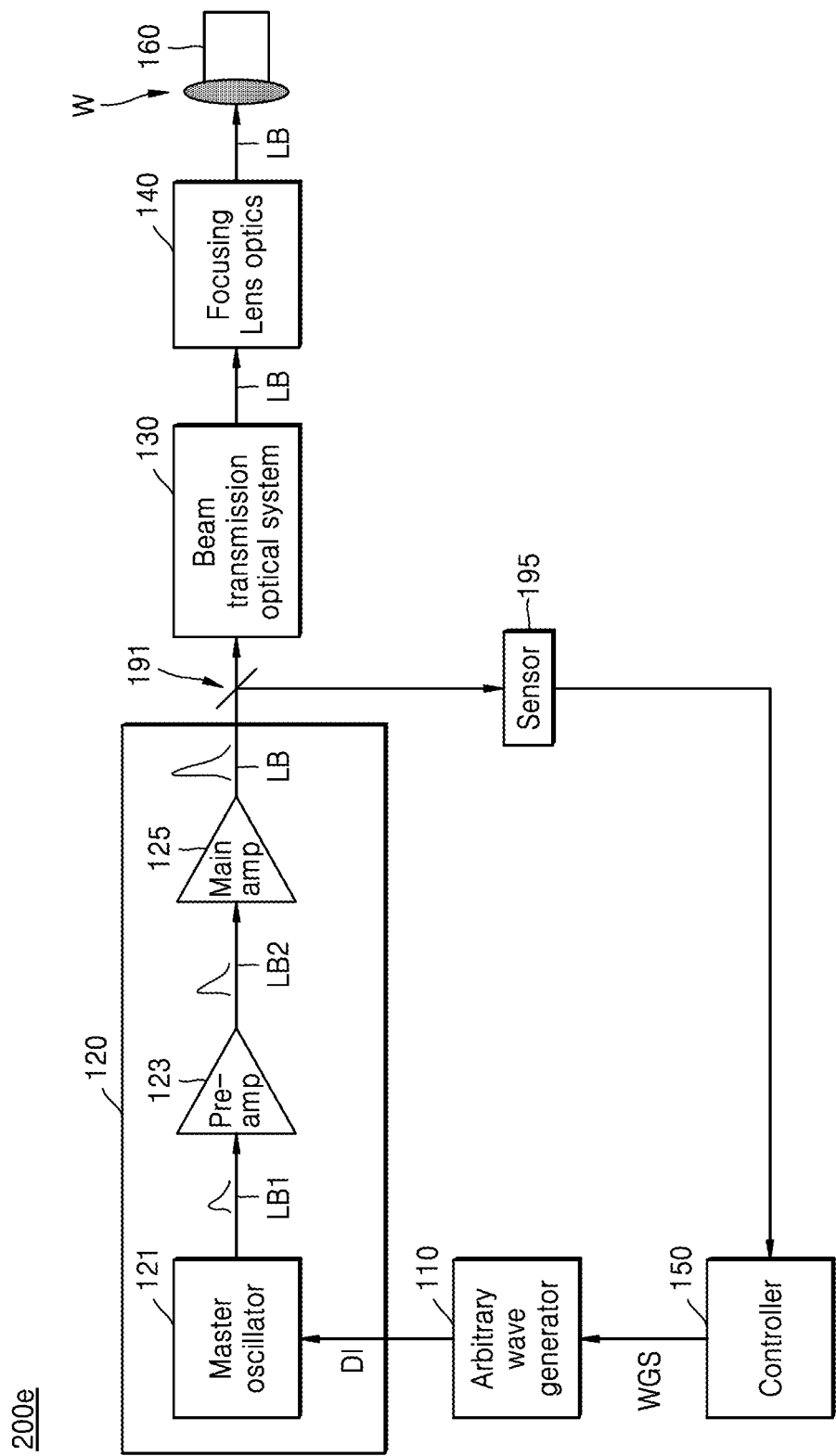

FIG. 7E is a diagram illustrating a wafer processing apparatus 200e according to embodiments.

For convenience of description, description which is redundant with the description given above with reference to FIG. 7A may be omitted, and a difference will be mainly described.

Referring to FIG. 7E, the wafer processing apparatus 200e may include the arbitrary wave generator 110, the laser apparatus 120, the beam transmission optical system 130, the focusing lens optics 140, the controller 150, the wafer support 160, a beam splitter 191, and a sensor 195.

A part of the laser beam LB that has transmitted through the beam splitter 191 may be focused on the inside of the wafer W through the beam transmission optical system 130 and the focusing lens optics 140.

A part of the laser beam LB reflected by the beam splitter 191 may be sensed by the sensor 195.

Figure 8:
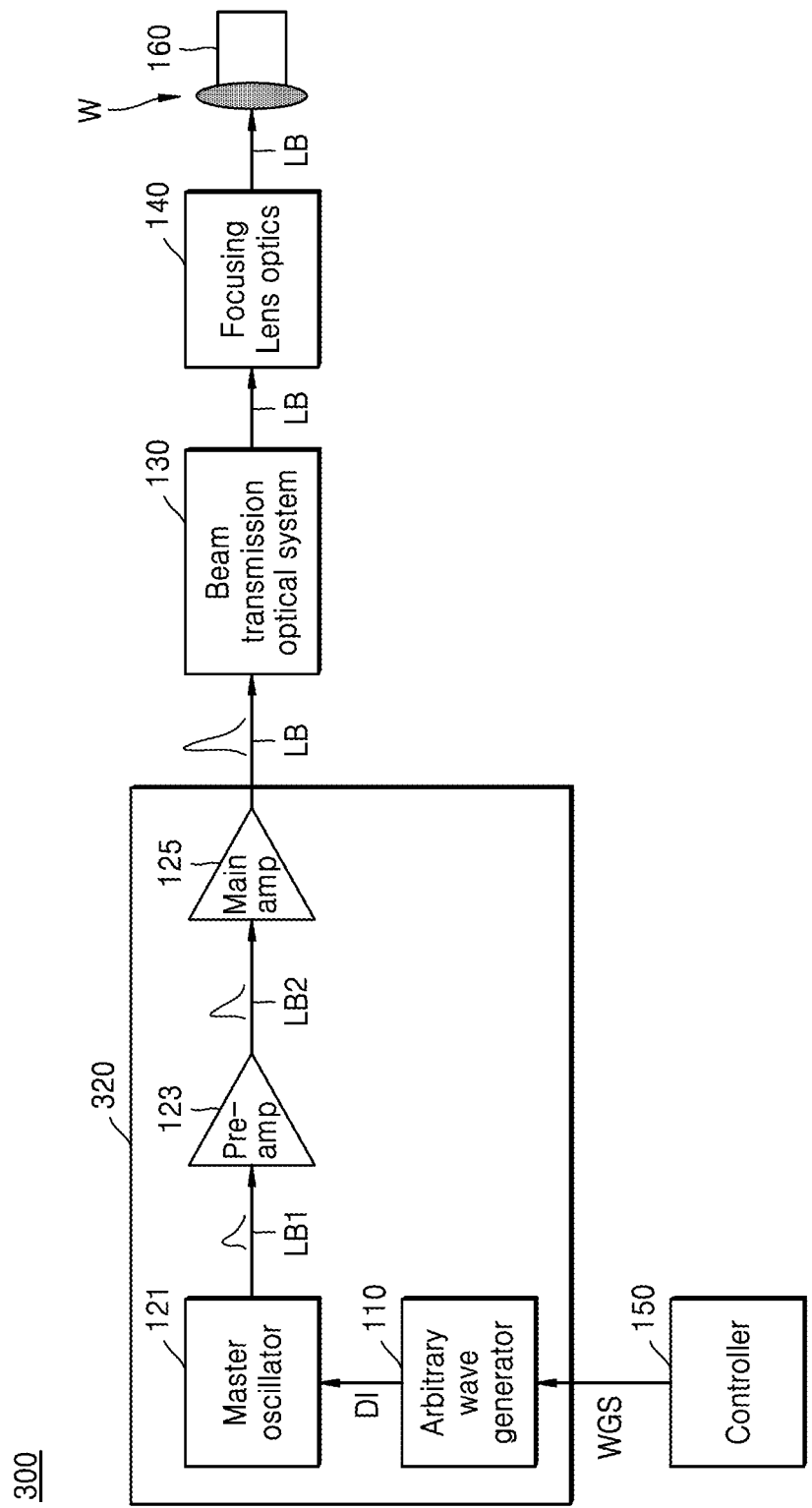

FIG. 8 is a diagram illustrating a wafer processing apparatus 300 according to embodiments.

For convenience of description, description which is redundant with the description given above with reference to FIGS. 1 to 3 may be omitted, and a difference will be mainly described.

Referring to FIG. 8, the wafer processing apparatus 300 may include a laser apparatus 320, the beam transmission optical system 130, the focusing lens optics 140, the controller 150, and the wafer support 160.

Unlike the laser apparatus 120 of FIG. 1, the laser apparatus 320 may include the arbitrary wave generator 110. The arbitrary wave generator 110 is substantially the same as described with reference to FIG. 1, except that the arbitrary wave generator 110 is embedded in the laser apparatus 320.

Figure 9:
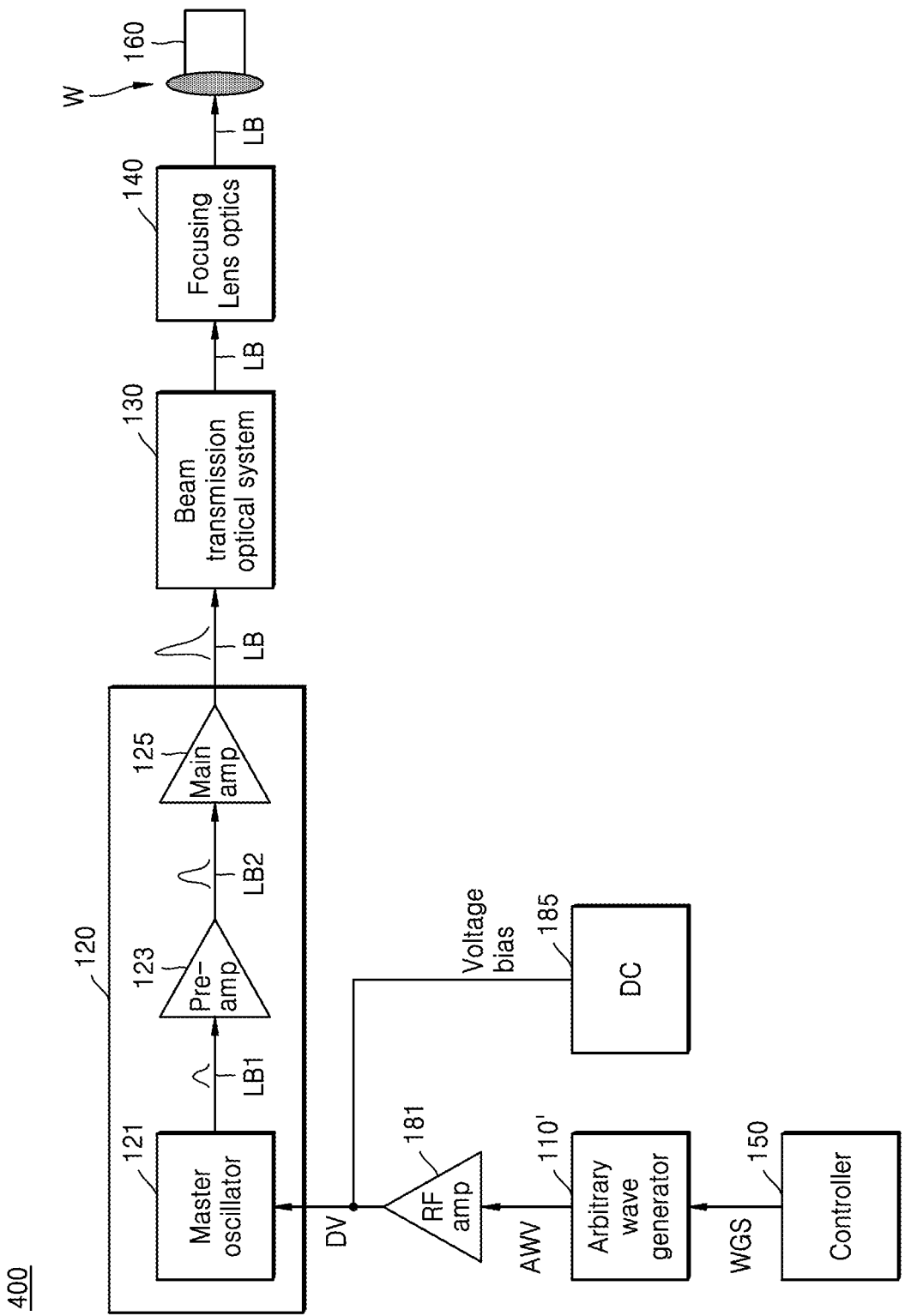

FIG. 9 is a diagram illustrating a wafer processing apparatus 400 according to embodiments.

For convenience of description, description which is redundant with the description given above with reference to FIGS. 1 to 3 may be omitted, and a difference will be mainly described.

Referring to FIG. 9, the wafer processing apparatus 400 may include an arbitrary wave generator 110', the laser apparatus 120, the beam transmission optical system 130, the focusing lens optics 140, the controller 150, the wafer support 160, an RF amplifier 181 and a voltage supply 185.

Unlike the arbitrary wave generator 110 of FIG. 1, the arbitrary wave generator 110' of FIG. 9 may supply an arbitrary wave voltage AWV, which is a non-sinusoidal continuous wave voltage, to the RF amplifier 181. The RF amplifier 181 may amplify the arbitrary wave voltage AWV to supply a driving voltage DV to the main oscillator 121. The arbitrary wave voltage AWV may have the same wave as the driving voltage DV by amplification of the amplitude.

The voltage supply 185 may provide the main oscillator 121 with a voltage bias smaller than a threshold voltage value and having a constant magnitude. Accordingly, the leakage of power provided by the RF amplifier 181 may be prevented, and the pulse peak power performance of the main oscillator 121 may be guaranteed or improved.

Figure 10:
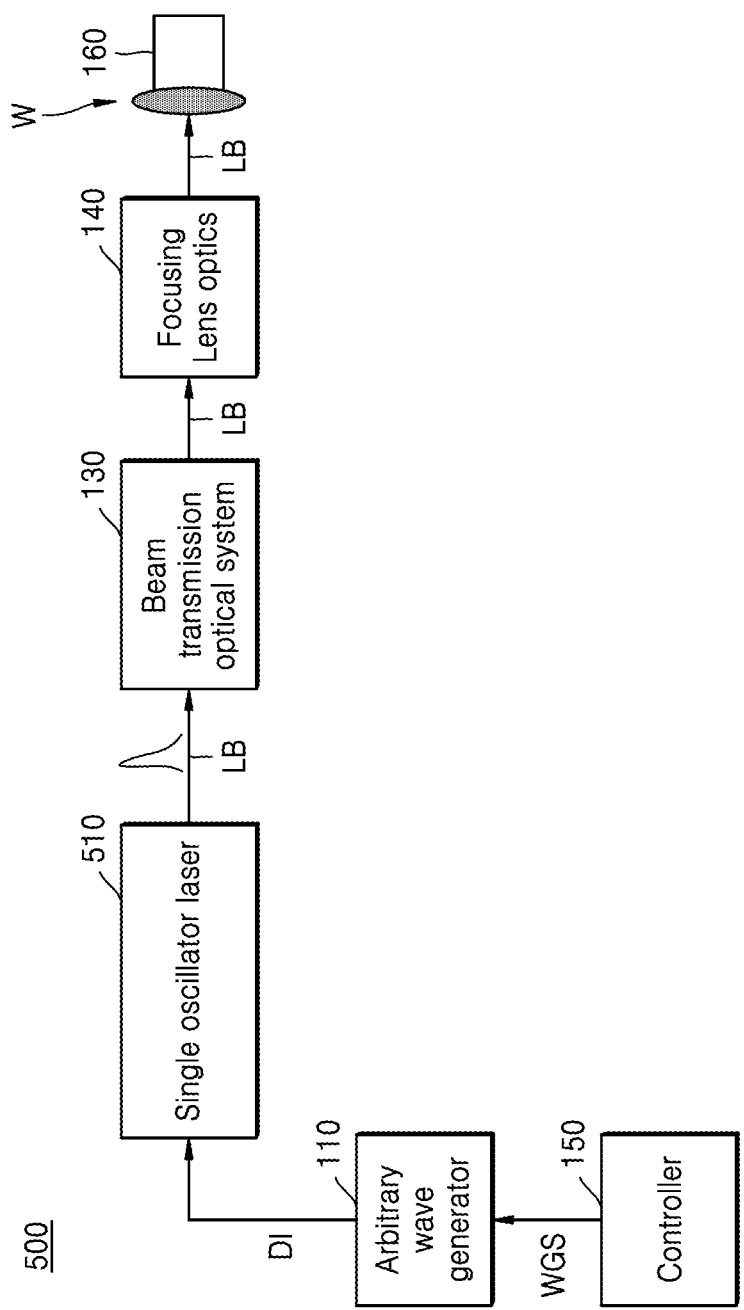

FIG. 10 is a diagram illustrating a wafer processing apparatus 500 according to embodiments.

For convenience of description, description previously given with reference to FIGS. 1 to 3 may be omitted and differences are mainly described.

Referring to FIG. 10, the wafer processing apparatus 500 may include the arbitrary wave generator 110, a single oscillator laser 510, the beam transmission optical system 130, the focusing lens optics 140, the controller 150, and the wafer support 160.

Unlike the wafer processing apparatus 100a of FIG. 1, the wafer processing apparatus 500 of FIG. 10 may include the single oscillator laser 510. The single oscillator laser 510 may output the laser beam LB having a time profile that is substantially the same as that described with reference to FIG. 3 based on the driving current DI of the arbitrary wave generator 110.

Figure 11:
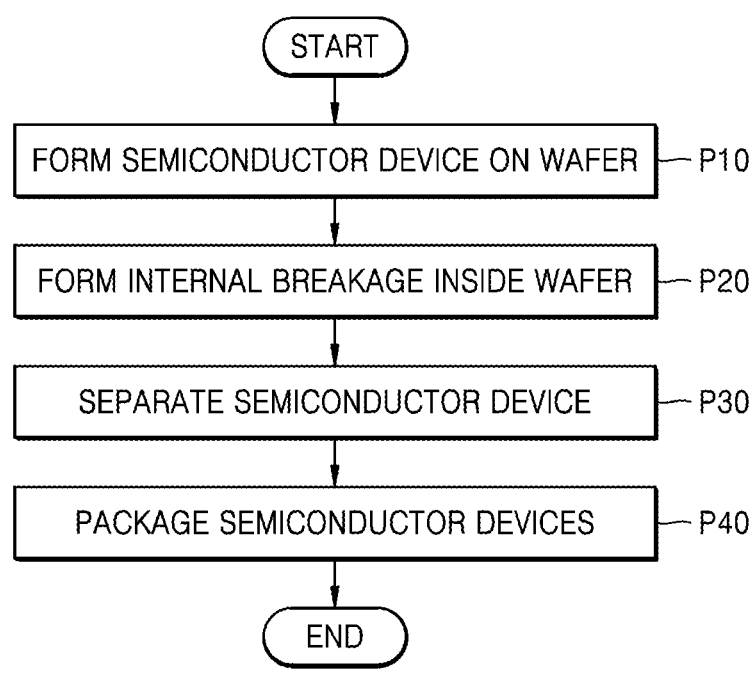
FIG. 11 is a flowchart illustrating a method of manufacturing a semiconductor device in accordance with embodiments.

FIG. 11 is a flowchart illustrating a method of manufacturing a semiconductor device in accordance with embodiments.

Figure 12A:
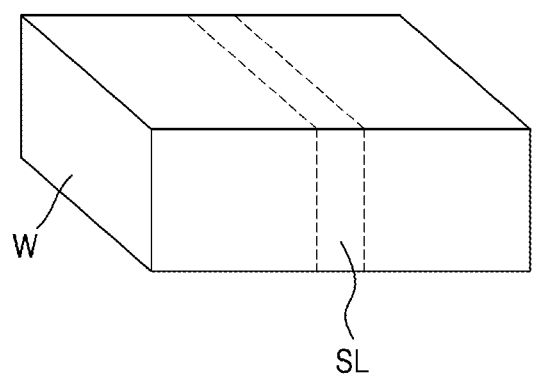
FIGS. 12A to 12C are schematic diagrams illustrating a method of manufacturing a semiconductor device according to embodiments.
Figure 12B:
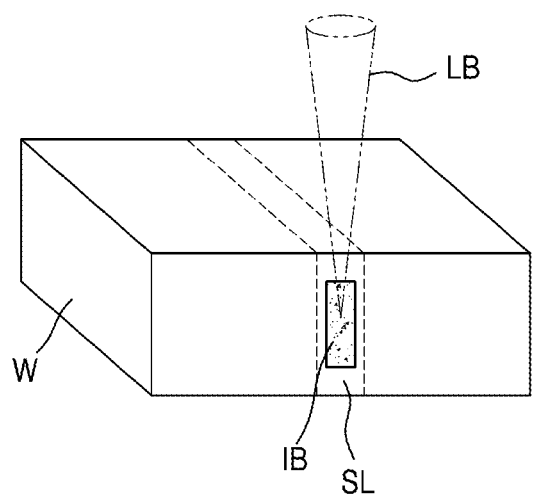
Figure 12C:
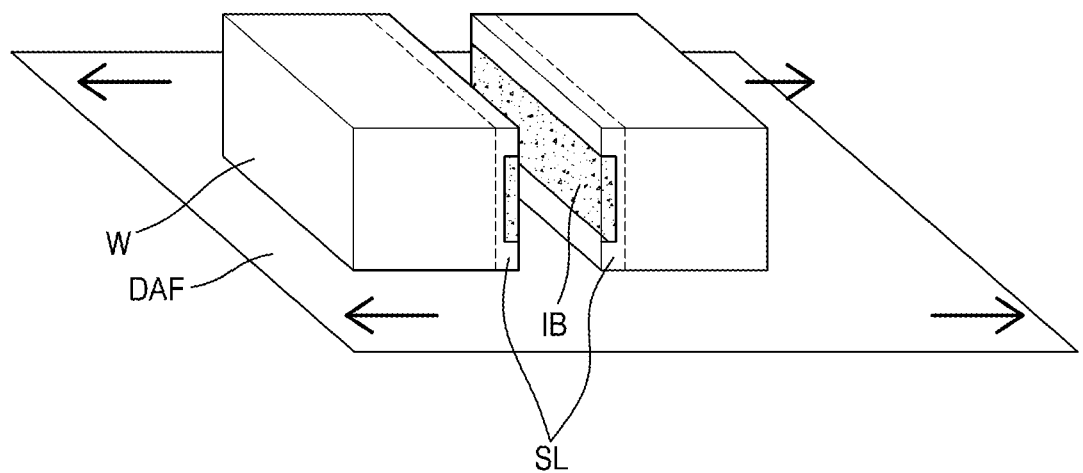

FIGS. 12A to 12C are schematic diagrams illustrating a method of manufacturing a semiconductor device according to embodiments.

Referring to FIGS. 11 and 12A, in P10, the semiconductor device may be formed on the wafer W. The wafer W may include device formation regions in which semiconductor devices are formed, and scribe lanes SL separating the device formation regions.

The wafer W may include, for example, silicon (Si). The wafer W may include a semiconductor element, such as germanium (Ge), or a compound semiconductor such as silicon carbide (SiC), gallium arsenide (GaAs), indium arsenide (InAs), or indium phosphide (InP).

According to some embodiments, the wafer W may have a silicon on insulator (SOI) structure. The wafer W may include a buried oxide layer formed on the front surface of the wafer W. According to some embodiments, the wafer W may include a conductive region (for example, an impurity-doped well) formed in the front surface of the wafer W. According to some embodiments, the wafer W may have various isolation structures such as a shallow trench isolation (STI) isolating the impurity-doped well. Although not shown, a plurality of material layers may be formed in the front surface of the wafer W. At least one material layer may be formed in the back surface of the wafer W.

The semiconductor device formed in the wafer W may be any one of a memory device and a non-memory device. According to some embodiments, the memory device may include a non-volatile NAND flash memory. According to some embodiments, the memory device may include phase change random access memory (PRAM), magnetic random access memory (MRAM), resistance random access memory (ReRAM), ferroelectric random access memory (FRAM), NOR flash memory, etc. Also, the memory device may be a volatile memory device where data is lost when power is cut off, like dynamic random access memory (DRAM) and static random access memory (SRAM). According to some embodiments, the memory device may be a logic chip, a measurement device, a communication device, a digital signal processor (DSP), or a system-on-chip (SoC).

A process of forming the semiconductor device may include: i) an oxidation process of forming an oxide film, ii) a lithography process including spin coating, exposure and development, iii) a thin film deposition process, iv) a dry or wet etching process, and v) a metal wiring process.

The oxidation process is a process of chemically reacting oxygen or water vapor with a silicon substrate surface at a high temperature of 800 to 1200 degrees to form a thin and uniform silicon oxide film. The oxidation process may include dry oxidation and wet oxidation. Dry oxidation may react the wafer W with oxygen gas to form an oxide film. Wet oxidation may react the wafer W with oxygen and water vapor to form an oxide film.

According to some embodiments, an SOI structure may be formed on a substrate by the oxidation process. The substrate may also include a buried oxide layer. According to some embodiments, the substrate may have various device isolation structures such as STI.

The lithography process is a process of transferring a circuit pattern previously formed on a lithography mask to the substrate through exposure. The lithography process may be performed in the order of spin coating, exposure and development process.

The thin film deposition process may include any one of, for example, atomic layer deposition (ALD), chemical vapor deposition (CVD), plasma-enhanced CVD (PECVD), metal organic CVD (MOCVD), physical vapor deposition (PVD), reactive pulsed laser deposition, molecular beam epitaxy and DC magnetron sputtering.

The dry etching process may include any one of, for example, reactive ion etching (RIE), deep RIE (DRIE), ion beam etching (IBE), and Ar milling. As another example, the dry etching process that may be performed on the wafer W may be Atomic Layer Etching (ALE). In addition, the wet etching process that may be performed on the wafer W may include an etching process that uses at least one of $Cl_2$, HCl, $CHF_3$, $CH_2F_2$, $CH_3F$, $H_2$, $BCL_3$, $SiCl_4$, $Br_2$, HBr, $NF_3$, $CF_4$, $C_2F_6$, $C_4F_8$, $SF_6$, $O_2$, $SO_2$, and COS as an etchant gas.

The metal wiring process may be a process of forming a conductive wiring (metal line) to implement a circuit pattern for operation of the semiconductor device. By the metal wiring process, transmission paths of ground, power, and signal for operating the semiconductor device may be formed. The metal wiring may include gold, platinum, silver, aluminum, and tungsten.

According to some embodiments, in the process of forming the semiconductor device, a planarization process, such as a chemical mechanical polishing (CMP) process, an ion implantation process, etc., may also be performed.

Referring to FIGS. 11 and 12B, in P20, the internal breakage IB may be formed in the wafer W.

The internal breakage IB of the wafer W may be formed by the laser beam LB output by any one of the wafer processing apparatus 100a of FIG. 1 and the wafer processing apparatuses 100b, 100c, 200a, 200b, 200c, 200d, 200e, 300, 400, and 500 of FIGS. 6A to 10 respectively.

According to some embodiments, to reduce the thickness of the wafer W before the formation of the internal breakage IB in the wafer W, a pre-grinding process on the back surface of the wafer W (i.e., a surface opposite to the front surface of the wafer W on which the semiconductor device is formed) may be performed.

Referring to FIGS. 11 and 12C, in P30, the semiconductor device may be separated.

After attaching the wafer W on which the internal breakage IB is formed to a die attach film DAF, the semiconductor device may be separated by stretching the die attach film DAF in the horizontal direction.

According to some embodiments, before providing the die attach film DAF, a back-grinding process of polishing the back surface of the wafer W may be additionally performed.

Referring to FIG. 11, in P40, the separated semiconductor devices may be packaged.

The packaging process may include a wire bonding process, a molding process, a marking process, a solder ball mounting process, etc.

While the inventive concept has been particularly shown and described with reference to embodiments thereof, it will be understood that various changes in form and details may be made therein without departing from the scope of the following claims.

What is claimed is:
1. A wafer processing apparatus comprising:
a laser apparatus configured to generate a laser beam;
a focusing lens optical system configured to focus the laser beam on an inside of a wafer;
an arbitrary wave generator configured to supply driving power to the laser apparatus; and a controller configured to control the arbitrary wave generator, wherein the laser beam comprises a plurality of pulses sequentially emitted from the laser apparatus, and wherein each of the plurality of pulses is a non-Gaussian pulse, and a full width at half maximum (FWHM) of each of the plurality of pulses ranges from 1 ps to 500 ns.

2. The wafer processing apparatus of claim 1, wherein a time interval from a start point to a peak point of each of the plurality of pulses is less than a time interval from the peak point to an end point of the plurality of pulses.

3. The wafer processing apparatus of claim 1, wherein a rise time taken for an intensity of each of the plurality of pulses to rise from 10% of a peak point to 90% of the peak point is 1% or more of the FWHM and less than 50% of the FWHM.

4. The wafer processing apparatus of claim 3, wherein the rise time is 30% or less of the FWHM.

5. The wafer processing apparatus of claim 3, wherein the rise time is 10% or less of the FWHM.

6. The wafer processing apparatus of claim 1, wherein the laser apparatus comprises:
a main oscillator configured to output a first laser beam;
a pre-amplifier configured to amplify the first laser beam and output a second laser beam; and
a main amplifier configured to amplify the second laser beam and output the laser beam.

7. The wafer processing apparatus of claim 6, further comprising a sensor coupled to the main oscillator and configured to measure an intensity-time profile of the first laser beam and to provide the intensity-time profile to the controller.

8. The wafer processing apparatus of claim 6, further comprising a sensor coupled to the pre-amplifier and configured to measure an intensity-time profile of the second laser beam and to provide the intensity-time profile to the controller.

9. The wafer processing apparatus of claim 6, further comprising a sensor coupled to the main amplifier and configured to measure an intensity-time profile of the laser beam and to provide the intensity-time profile to the controller.

10. A wafer processing apparatus configured to perform a stealth dicing process on a wafer, the wafer processing apparatus comprising:
a laser apparatus configured to output a laser beam comprising a plurality of non-Gaussian pulses;
focusing lens optics configured to focus the laser beam on an inside of the wafer; and
an arbitrary wave generator configured to provide non-sinusoidal continuous wave power to the laser apparatus.

11. The wafer processing apparatus of claim 10, wherein the laser apparatus comprises:
a main oscillator configured to output a first laser beam;
a pre-amplifier configured to amplify the first laser beam and output a second laser beam; and
a main amplifier configured to amplify the second laser beam and output the laser beam.

12. The wafer processing apparatus of claim 11, wherein the arbitrary wave generator is configured to supply non-sinusoidal continuous wave power to the main oscillator,
the pre-amplifier and the main amplifier are driven by radio frequency (RF) sinusoidal power, and
the first laser beam comprises a plurality of non-Gaussian pulses.

13. The wafer processing apparatus of claim 11, wherein the arbitrary wave generator is configured to supply non-sinusoidal continuous wave power to the pre-amplifier,
the main oscillator and the main amplifier are driven by RF sinusoidal power,
the first laser beam comprises a plurality of Gaussian pulses, and
the second laser beam comprises a plurality of non-Gaussian pulses.

14. The wafer processing apparatus of claim 11, wherein the arbitrary wave generator is configured to supply non-sinusoidal continuous wave power to the main amplifier,
the main oscillator and the pre-amplifier are driven by RF sinusoidal power, and
each of the first and second laser beams comprises a plurality of Gaussian pulses.

15. A wafer processing apparatus comprising:
a laser apparatus configured to generate a laser beam;
focusing lens optics configured to focus the laser beam on an inside of a wafer;
an arbitrary wave generator configured to supply driving power to the laser apparatus; and
a controller configured to control the arbitrary wave generator,
wherein the laser beam comprises a plurality of pulses sequentially emitted from the laser apparatus, and
wherein a rise time taken for an intensity of each of the plurality of pulses to rise from 10% of a peak point to 90% of the peak point is 1% or more of a full width at half maximum (FWHM) of each of the plurality of pulses and less than 50% of the FWHM.

16. The wafer processing apparatus of claim 15, wherein an intensity-time profile of each of the plurality of pulses follows Equation 1 below, $$I(t) = E \frac{\beta}{2\alpha \cdot \Gamma\left(\frac{1}{\beta}\right)} \exp\left[-\left(\frac{t-\mu}{\alpha}\right)^\beta\right]\left[1 + \mathrm{erf}\left(\frac{s}{\sqrt{2}} \cdot \frac{t-\mu}{\alpha}\right)\right] \quad [\text{Equation 1}]$$

wherein E denotes an energy parameter for controlling an energy amount of each of the plurality of pulses, $\alpha$ denotes a pulse width parameter for controlling a pulse width of each of the plurality of pulses, $\beta$ denotes a kurtosis parameter for controlling kurtosis of each of the plurality of pulses, s denotes a skewness parameter for controlling skewness of each of the plurality of pulses, $\mu$ denotes a parameter for controlling a time axis parallel movement of each of the plurality of pulses, and a gamma function $\Gamma(z)$ and a Gaussian error function erf (x) follow Equation 2 below, and $$\Gamma(z) = \int_0^\infty x^{z-1} e^{-x} dx \quad [\text{Equation 2}]$$
$$\mathrm{erf}(x) = \frac{2}{\pi} \int_0^x e^{-t^2} dt$$

the skewness parameter s is greater than 0 and 100 or less.

17. The wafer processing apparatus of claim 16, wherein the skewness parameter s is 10 or more.

18. The wafer processing apparatus of claim 16, wherein the controller is configured to generate a wave generation signal for controlling the arbitrary wave generator, and wherein the wave generation signal comprises a bit for controlling the skewness parameters.

19. The wafer processing apparatus of claim 16, wherein the wave generation signal comprises a bit for controlling the kurtosis parameter $\beta$.

20. The wafer processing apparatus of claim 15, wherein the rise time is 30% or less of the FWHM.

* * * * *